United States Patent
Lee et al.

(10) Patent No.: US 9,595,346 B2
(45) Date of Patent: Mar. 14, 2017

(54) 3-DIMENSIONAL SEMICONDUCTOR MEMORY DEVICE AND OPERATING METHOD THEREOF

(71) Applicant: Samsung Electronics Co., Ltd., Suwon-si (KR)

(72) Inventors: Changhyun Lee, Suwon-si (KR); Dohyun Lee, Hwaseong-si (KR); Youngwoo Park, Seoul (KR); Su Jin Ahn, Seoul (KR); Jaeduk Lee, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/157,720

(22) Filed: May 18, 2016

(65) Prior Publication Data

US 2016/0343450 A1    Nov. 24, 2016

(30) Foreign Application Priority Data

May 21, 2015    (KR) ........................ 10-2015-0071180

(51) Int. Cl.
*G11C 11/34* (2006.01)
*G11C 16/34* (2006.01)
(Continued)

(52) U.S. Cl.
CPC ...... *G11C 16/3459* (2013.01); *G11C 16/0483* (2013.01); *G11C 16/10* (2013.01); *H01L 23/528* (2013.01); *H01L 27/1157* (2013.01); *H01L 27/11524* (2013.01); *H01L 27/11526* (2013.01); *H01L 27/11556* (2013.01); *H01L 27/11573* (2013.01); *H01L 27/11582* (2013.01); *H01L 29/04* (2013.01); *H01L 29/16* (2013.01)

(58) Field of Classification Search
CPC .. G11C 16/00; G11C 2213/71; G11C 2213/75
USPC ............. 365/185.17, 185.11, 185.13, 185.26
See application file for complete search history.

(56) References Cited

U.S. PATENT DOCUMENTS

| 7,679,133 B2 | 3/2010 | Son et al. |
| 8,507,918 B2 | 8/2013 | Son et al. |

(Continued)

*Primary Examiner* — Han Yang
(74) *Attorney, Agent, or Firm* — Muir Patent Law, PLLC

(57) ABSTRACT

Disclosed is a three-dimensional semiconductor memory device, comprising a cell array formed on a first substrate and a peripheral circuit formed on a second substrate that is at least partially overlapped by the first substrate, wherein the peripheral circuit is configured to provide signals for controlling the cell array. The cell array comprises insulating patterns and gate patterns stacked alternately on the first substrate, and at least a first pillar formed in a direction perpendicular to the first substrate and being in contact with the first substrate through the insulating patterns and the gate patterns. The three-dimensional semiconductor memory device further comprising a first ground selection transistor that includes a first gate pattern, adjacent to the first substrate and the first pillar, and a second ground selection transistor that includes a second gate pattern positioned on the first gate pattern and the first pillar, and wherein the first ground selection transistor is not programmable, and the second ground selection transistor is programmable.

20 Claims, 24 Drawing Sheets

(51) Int. Cl.
  *G11C 16/10* (2006.01)
  *G11C 16/04* (2006.01)
  *H01L 27/115* (2006.01)
  *H01L 23/528* (2006.01)
  *H01L 29/04* (2006.01)
  *H01L 29/16* (2006.01)

(56) References Cited

U.S. PATENT DOCUMENTS

| | | |
|---|---|---|
| 8,553,466 B2 | 10/2013 | Han et al. |
| 8,559,235 B2 | 10/2013 | Yoon et al. |
| 8,569,827 B2 | 10/2013 | Lee et al. |
| 8,654,587 B2 | 2/2014 | Yoon et al. |
| 8,664,780 B2 | 3/2014 | Han et al. |
| 8,824,209 B2 | 9/2014 | Kim et al. |
| 8,830,717 B2 | 9/2014 | Avila et al. |
| 8,891,307 B2 | 11/2014 | Nam |
| 8,912,592 B2 | 12/2014 | Lim et al. |
| 2011/0233648 A1 | 9/2011 | Seol et al. |
| 2012/0267702 A1 | 10/2012 | Jee et al. |
| 2013/0170297 A1* | 7/2013 | Nam .................. G11C 16/0483 365/185.09 |
| 2013/0201758 A1* | 8/2013 | Kim .................. G11C 16/0483 365/185.2 |
| 2013/0215679 A1 | 8/2013 | Lee et al. |
| 2014/0070302 A1 | 3/2014 | Yoo et al. |

* cited by examiner

FIG. 16

| String | Erase Operation | Program Operation | Read Operation |
|---|---|---|---|
| BLi | Floating | Vcc/Vss | Vprch |
| SSL | Floating | Vcc+Vth | Vread |
| SDWL | Floating | Vpass | Vread |
| WL63 | Vss | Vpgm/Vpass | Vrd/Vread |
| ⋮ | ⋮ | ⋮ | ⋮ |
| WL0 | Vss | Vpgm/Vpass | Vrd/Vread |
| GDWL2 | Floating | Vdmy2 | Vread |
| GDWL1 | Floating | Vdmy1 | Vread |
| GSL2 | Floating | Vss(or Vg2) | Vread |
| GSL1 | Vss→Floating | Vss(or Vg1) | Vread |
| CSL | Floating | Vss | Vss |

FIG. 18

| String | Erase Operation | Program Operation | Read Operation |
|---|---|---|---|
| BLi | Floating | Vcc/Vss | Vprch |
| SSL | Floating | Vcc+Vth | Vread |
| SDWL | Floating | Vpass | Vread |
| WL63 | Vss(or 0V) | Vpgm/Vpass | Vrd/Vread |
| ⋮ | ⋮ | ⋮ | ⋮ |
| WL0 | Floating(or 0V) | Vpgm/Vpass | Vrd/Vread |
| GDWL2 | Floating | Vss(or Vdmy2) | Vread |
| GDWL1 | Floating | Vss(or Vdmy1) | Vread |
| GSL3 | Floating | Vss(or Vg2) | Vread |
| GSL2 | Floating | Vss(or Vg2) | Vread |
| GSL1 | Vss→Floating | Vss(or Vg1) | Vread |
| CSL | Floating | Vss | Vss |

# 3-DIMENSIONAL SEMICONDUCTOR MEMORY DEVICE AND OPERATING METHOD THEREOF

CROSS-REFERENCE TO RELATED APPLICATIONS

This application claims priority under 35 U.S.C. §119 to Korean Patent Application No. 10-2015-0071180, filed May 21, 2015, in the Korean Intellectual Property Office, the entire contents of which are hereby incorporated by reference.

BACKGROUND

The present disclosure relates to a semiconductor memory, and more particularly, relates to a three-dimensional semiconductor memory device and an operating method thereof.

A semiconductor memory device is a storage device which is manufactured using semiconductors such as, but not limited to, silicon (Si), germanium (Ge), gallium arsenide (GaAs), and indium phosphide (InP). Generally, semiconductor memory devices can be classified as volatile memory devices or nonvolatile memory devices.

The volatile memory devices lose data stored therein at power-off. The volatile memory devices include the following examples: a static RAM (SRAM), a dynamic RAM (DRAM), a synchronous DRAM (SDRAM), etc. The nonvolatile memory devices may retain stored contents even at power-off. The nonvolatile memory devices include the following examples: a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), etc. Flash memory devices may be further classified into a NOR type and a NAND type.

Semiconductor memory devices with three-dimensional array structures are being researched and developed to improve the degree of integration thereof. For example, vertical memory cell strings in which the semiconductor memory device including a three-dimensional array structure is connected to a substrate are being researched. In this structure, ground selection transistors GST may be configured such that channels of horizontal and vertical structures are connected in series. In addition, threshold voltages of the ground selection transistors GST are widely distributed according to shapes or placements of channel holes that occur at a manufacturing process. However, these features may cause disturbance or a decrease in a cell current.

The disclosed embodiments have been provided to address these and other shortcomings.

SUMMARY

Embodiments of the disclosed concepts provide a nonvolatile memory device having a ground selection transistor of a constant operating feature and an operating method thereof.

In some exemplary embodiments, the present disclosure is directed to a three-dimensional semiconductor memory device comprising: a cell array formed on a first substrate; and a peripheral circuit formed on a second substrate that is at least partially overlapped by the first substrate, the peripheral circuit being configured to provide signals for controlling the cell array, wherein the cell array comprises: insulating patterns and gate patterns stacked alternately on the first substrate; and at least a first pillar formed in a direction perpendicular to the first substrate and being in contact with the first substrate through the insulating patterns and the gate patterns, wherein a first ground selection transistor includes a first gate pattern, adjacent to the first substrate and the first pillar, and a second ground selection transistor includes a second gate pattern positioned on the first gate pattern and the first pillar, and wherein the first ground selection transistor is not programmable, and the second ground selection transistor is programmable.

In some embodiments, the present disclosure may further include wherein the first substrate comprises a poly-crystalline silicon semiconductor.

In some embodiments, the present disclosure may further include wherein the first pillar comprises: a lower active pattern crossing the first gate pattern; and an upper active pattern crossing the second gate pattern.

In some embodiments, the present disclosure may further include wherein the lower active pattern is provided in the form of a pillar and the upper active pattern is provided in the form of a tube which is filled with a filling dielectric pattern.

In some embodiments, the present disclosure may further include wherein a third gate pattern corresponding to a dummy word line and gate patterns corresponding to a plurality of word lines are formed on the second gate pattern, and wherein a distance between the second gate pattern and the third gate pattern is wider than a cell distance between adjacent gate patterns among the plurality of word lines.

In some embodiments, the present disclosure may further include wherein a threshold voltage of the second ground selection transistor is set according to a characteristic of the first ground selection transistor.

In some embodiments, the present disclosure may further include wherein the first gate pattern is separated into a plurality of segments corresponding to a plurality of planes, and wherein, at a program verify operation on the second ground selection transistor, the first gate pattern is activated by a stacked plane set and a verify operation is performed by the stacked plane set.

In some embodiments, the present disclosure may further include wherein the device is configured such that a level of a voltage applied to the first gate pattern is identical to that applied to the second gate pattern.

In some embodiments, the present disclosure may further include wherein the device is configured such that during a program operation on the cell array, a ground voltage is applied to a first ground selection line connected to the first gate pattern and to a second ground selection line connected to the second gate pattern.

In some embodiments, the present disclosure may further include wherein the device is configured such that during a program operation on the cell array, a first ground selection voltage higher than a ground voltage is applied to a first ground selection line connected to the first gate pattern, and the ground voltage is applied to a second ground selection line connected to the second gate pattern.

In some embodiments, the present disclosure may further include wherein the device is configured such that during a program operation on the cell array, a ground voltage is applied to a first ground selection line connected to the first gate pattern and a second ground selection voltage higher than the ground voltage is applied to a second ground selection line connected to the second gate pattern.

In some embodiments, the present disclosure may further include wherein the device is configured such that during a program operation on the cell array, a first ground selection voltage is applied to a first ground selection line connected to the first gate pattern and a second ground selection voltage higher than the first ground selection voltage is applied to a second ground selection line connected to the second gate pattern.

In some exemplary embodiments, the present disclosure is directed to a three-dimensional semiconductor memory device comprising: a peripheral circuit formed on a first substrate; a second substrate at least partially overlapping the first substrate and including a poly-crystalline silicon semiconductor; a stack structure including insulating patterns and gate patterns stacked alternately on the second substrate; and at least a first pillar penetrating the stack structure and contacting the second substrate through conductive material and insulating materials in a direction perpendicular to the second substrate, wherein a first ground selection transistor having a first gate insulating layer is formed to include the first pillar and a first gate pattern and is adjacent to the second substrate, and a second ground selection transistor having a second gate insulating layer is formed to include the first pillar and a second gate pattern, which is positioned on the first gate pattern, and wherein the first ground selection transistor does not include a charge storage layer.

In some embodiments, the present disclosure may further include wherein the first pillar comprises: a lower active pattern penetrating the first gate pattern and contacting a well area of the second substrate; and an upper active pattern penetrating the second gate pattern and stacked on the lower active pattern.

In some embodiments, the present disclosure may further include wherein the lower active pattern comprises a poly-crystalline silicon semiconductor.

In some embodiments, the present disclosure may further include wherein a first ground selection transistor including the lower active pattern and the first gate pattern comprises a vertical channel perpendicular to the second substrate and a horizontal channel parallel to the second substrate.

In some embodiments, the present disclosure may further include wherein a third gate pattern corresponding to a dummy word line is provided on the second gate pattern, and wherein a distance between the second gate pattern and the third gate pattern is wider than a distance between gate patterns corresponding to cells for storing data.

In some exemplary embodiments, the present disclosure is directed to an operating method of a three-dimensional semiconductor memory device in which a cell array area and a peripheral area are formed respectively on different substrates and in which a plurality of cell strings is formed at the cell array area, each of the plurality of cell strings including a first ground selection transistor not including a charge storage layer and at least one second ground selection transistor that is programmable, the operating method comprising: applying an erase voltage to a well area of the cell array area; while applying the erase voltage to the well area, floating a gate of one second ground selection transistor; and floating a gate of one first ground selection transistor.

In some embodiments, the present disclosure may further include wherein the gate of the one second ground selection transistor is floated when the erase voltage is applied to the well area.

In some embodiments, the present disclosure may further include wherein the cell array area is formed on a poly-crystalline silicon semiconductor substrate.

In some exemplary embodiments, the present disclosure is directed to a three-dimensional semiconductor memory device comprising: a cell array formed on a first substrate, the cell array including a plurality of vertical NAND strings; a peripheral circuit formed on a second substrate that at least partially overlaps the first substrate, the peripheral circuit being configured to provide signals for controlling the cell array; a connection circuit interconnection electrically connecting the cell array with the peripheral circuit; wherein the cell array comprises: a first gate transistor including a first gate pattern and configured to function as a pass transistor; and at least one second gate transistor including a second gate pattern, the at least one second gate transistor is programmable.

In some embodiments, the present disclosure may further wherein the first substrate comprises a poly-crystalline silicon semiconductor.

In some embodiments, the present disclosure may further include a third gate pattern corresponding to a dummy word line; fourth gate patterns corresponding to a plurality of word lines are formed on the second gate pattern, and wherein a distance between the second gate pattern and the third gate pattern is wider than a cell distance between adjacent fourth gate patterns.

In one aspect, the embodiments are directed to provide a three-dimensional semiconductor memory device. The three-dimensional semiconductor memory device may include a cell array on a first substrate, and a peripheral circuit on a second substrate spaced from the first substrate and providing a signal for controlling the cell array. The cell array may include insulating patterns and gate patterns stacked alternately on the first substrate, and at least one pillar formed in a direction perpendicular to the first substrate and contacting with the first substrate through the insulating patterns and the gate patterns. A first ground selection transistor may be defined by a first gate pattern, adjacent to the first substrate, and the pillar and may not be capable of being programmed and a second selection transistor may be defined by a second gate pattern, positioned on the first gate pattern, and the pillar and may be capable of being programmed.

In another aspect, the embodiments are directed to provide a three-dimensional semiconductor memory device. The three-dimensional semiconductor memory device may include a substrate including poly-crystalline silicon semiconductor, a stack structure including insulating patterns and gate patterns stacked alternately and in turn on the substrate, and at least one pillar penetrating the stack structure and contacting with the substrate through the conductive material and insulating materials in a direction perpendicular to the substrate. A first ground selection transistor having a first insulating layer may be formed between a first gate pattern, adjacent to the substrate, from among the gate patterns and the pillar and a second ground selection transistor having a second gate insulating layer may be formed between a second gate pattern, positioned on the first gate pattern, and the pillar. The first gate insulating layer may not include a charge storage layer.

In another aspect, the embodiments are directed to provide an operating method of a three-dimensional semiconductor memory device in which cell array and peripheral areas are respectively formed on different substrates and in which a plurality of cell strings each including a first ground selection transistor not including a charge storage layer and at least one second ground selection transistor being programmable is formed at the cell array area. The operating method may include applying an erase voltage to a well area of the cell array area, floating a gate of the second ground selection transistor, and floating a gate of the first ground selection transistor.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 16 is a table schematically illustrating a bias condition of an exemplary cell string of FIG. 15 for an operating mode, consistent with certain disclosed embodiments;

FIG. 18 is a table schematically illustrating a bias condition of an exemplary cell string of FIG. 17 for an operating mode, according to certain disclosed embodiments;

DETAILED DESCRIPTION

Figure 1:
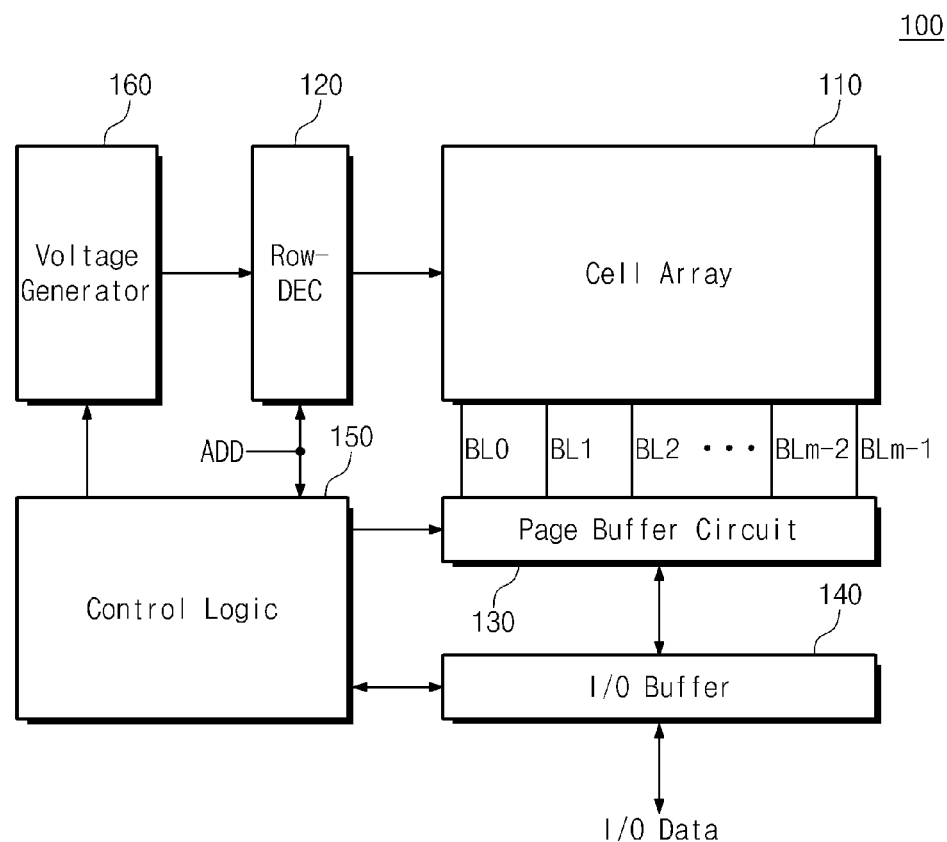
FIG. 1 is a block diagram schematically illustrating an exemplary nonvolatile memory device, according to certain disclosed embodiments.

Advantages and features of the disclosed embodiments and methods of accomplishing them will be made apparent with reference to the accompanying drawings and some embodiments to be described below. The disclosed embodiments may, however, be embodied in various different forms, and should be construed as limited, not by the embodiments set forth herein, but only by the accompanying claims. Accordingly, known processes, elements, and techniques are not described with respect to some of the disclosed embodiments. Unless otherwise noted, like reference numerals denote like elements throughout the attached drawings and written description, and thus descriptions will not be repeated. In the drawings, the sizes and relative sizes of layers and regions may be exaggerated for clarity. It will be understood that, although the terms "first", "second", "third", etc., may be used herein to describe various elements, components, regions, layers and/or sections, these elements, components, regions, layers and/or sections should not be limited by these terms. Unless indicated otherwise, these terms are only used to distinguish one element, component, region, layer and/or section from another element, component, region, layer and/or section. Thus, a first element, component, region, layer and/or section discussed below could be termed a second element, component, region, layer and/or section without departing from the teachings of the disclosure.

The terminology used herein is for the purpose of describing particular examples and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, components, and/or groups, and do not preclude the presence or addition of one or more other features, integers, steps, operations, elements, components, and/or groups.

It will be understood that when an element or layer is referred to as being "on," "connected to," "in contact with," and/or "coupled to" another element or layer, it can be directly on, connected to, in contact with and/or coupled to the other element or layer or intervening elements or layers may be present. In contrast, when an element is referred to as being "directly on," "directly connected to," or "directly coupled to" another element or layer or as "contacting"

another element or layer, there are no intervening elements or layers present. Like reference numerals throughout this specification denote like elements. As used herein, the term "and/or" includes any and all combinations of one or more of the associated listed items. Also, the term "exemplary" is intended to refer to an example or illustration.

Spatially relative terms, such as "beneath," "below," "lower," "above," "upper," and the like, may be used herein for ease of description in describing one element's or feature's relationship to another/other element(s) or feature(s) as illustrated in the figures. It will be understood that spatially relative terms are intended to encompass different orientations of the device in use or operation in addition to the orientation depicted in the figures. For example, if the device in the figures is turned over, elements described as "below" or "beneath" another/other element(s) or feature(s) would then be oriented "above," "on," or "on top of" the another/other element(s) or feature(s). Thus, the term "below" can encompass both an orientation of above and below. The device may be otherwise oriented (rotated 90 degrees or at other orientations) and the spatially relative descriptors used herein may be interpreted accordingly. In addition, it will also be understood that when a layer is referred to as being "between" two layers, it can be the only layer between the two layers, or one or more intervening layers may also be present.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

The semiconductor devices described herein may be part of an electronic device, such as a semiconductor memory chip or semiconductor logic chip, a stack of such chips, a semiconductor package including a package substrate and one or more semiconductor chips, a package-on-package device, or a semiconductor memory module, for example. In the case of memory, the semiconductor device may be part of a volatile or non-volatile memory. A chip or package that includes the semiconductor devices, such as the fin structures described herein, may also be referred to generally as a semiconductor device.

The exemplary embodiments will be described with reference to cross-sectional views and/or plan views, which are ideal exemplary views. Thicknesses of layers and areas are exaggerated for effective description of the technical contents in the drawings. Forms of the embodiments may be modified by the manufacturing technology and/or tolerance. Therefore, the disclosed embodiments are not intended to be limited to illustrated specific forms, and may include modifications of forms generated according to manufacturing processes. For example, an etching area illustrated at a right angle may be round or have a predetermined curvature. Therefore, areas illustrated in the drawings have overview properties, and shapes of the areas are illustrated special forms of the areas of a device, and are not intended to be limited to the scope of the disclosed embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Although the figures described herein may be referred to using language such as "one embodiment" or "certain embodiments," the figures and their corresponding descriptions are not intended to be mutually exclusive from other figures or descriptions, unless the context so indicates. Therefore, certain aspects from certain figures may be the same as features in other figures and/or certain aspects from certain figures may be different representations or different portions of particular exemplary embodiments.

In the disclosed embodiments, a nonvolatile memory device may be used as an example of a storage device or an electronic device to describe features and functions of certain concepts. However, other features and functions of the disclosed concepts may be easily understood according to information disclosed herein. Furthermore, the disclosed concepts may be implemented through other embodiments or applied thereto. Also, it will be apparent to those skilled in the art that various changes and modifications may be made without departing from the spirit and scope of the disclosure.

In certain embodiments, a three dimensional (3D) memory array is provided. The 3D memory array may be formed monolithically in one or more physical levels of arrays of memory cells having an active area disposed above a silicon substrate and circuitry associated with the operation of those memory cells, whether such associated circuitry is above or within such substrate (i.e., deposited on the substrate, etched into the substrate, etc.). As used herein, the term "monolithic" means that layers of each level of the array are directly deposited on the layers of each underlying level of the array.

In some embodiments of the present disclosure, the 3D memory array may include vertical NAND strings that are vertically oriented such that at least one memory cell is located over another memory cell. The at least one memory cell may comprise a charge trap layer. For example, each vertical NAND string may include at least one select transistor located over memory cells, the at least one select transistor having the same structure as the memory cells and being formed monolithically together with the memory cells.

The following patent documents, which are hereby incorporated by reference in their entireties, describe exemplary configurations of three-dimensional memory arrays, in which the three-dimensional memory array may be configured as a plurality of levels, with word lines and/or bit lines shared between levels: U.S. Pat. Nos. 7,679,133; 8,553,466; 8,654,587; 8,559,235; and U.S. Patent Application Publication No. 2011/0233648.

FIG. 1 is a block diagram schematically illustrating a nonvolatile memory device according to certain exemplary embodiments. Referring to FIG. 1, a nonvolatile memory device 100 may include a cell array 110, a row decoder 120, a page buffer 130, an input/output (I/O) buffer 140, control logic 150, and a voltage generator 160. The cell array 110 may be formed on a poly-crystalline silicon substrate. In some embodiments, each of the row decoder 120, a page buffer 130, an input/output (I/O) buffer 140, control logic 150, and a voltage generator 160 may be comprised of circuitry (e.g., active and passive circuit elements formed, for example, on an integrated circuit).

The cell array 110 may be connected to the row decoder 120 by way of word lines or selection lines. The cell array 110 may be connected to the page buffer 130 by way of bit lines BL0 to BLm−1. In some embodiments, the cell array 110 may include a plurality of cell strings each being a NAND type. Cell strings which are formed on the same well may compose a memory block BLK. Due to a vertical-direction feature, the cell array 110 stacked three-dimensionally may include vertical NAND strings in which at least one memory cell is positioned on another memory cell. For example, at least one memory cell may include a charge trap layer. Generally, a charge trap layer may consist of thin layers of one or more materials that trap electrons, or the "charge." Each vertical NAND string may include at least one selection transistor positioned on the memory cells. In certain embodiments, the at least one selection transistor may have the same structure as the memory cells and may be formed monolithically together with memory cells.

The cell array 110 according to certain exemplary embodiments may include a first ground selection transistor GST1, which does not include at least one data storage layer, and a second ground selection transistor GST2, which does include at least one data storage layer. The first ground selection transistor GST1, which may be formed at a location closer to the substrate than the second ground selection transistor GST2, may operate as a pass transistor, and a threshold voltage of the second ground selection transistor GST2 may be capable of being set or programmed, thereby making it possible to adjust characteristics of all ground selection transistors. This will be described in detail with reference to the following drawings.

The row decoder 120 may select one of the memory blocks of the cell array 110 in response to an address ADD, and the row decoder 120 may select one of the word lines in the memory block BLK selected by the row decoder 120. The row decoder 120 may transfer voltages, which are provided from the voltage generator 160, to the selected word line. During a program operation, the row decoder 120 may transfer a program voltage Vpgm or a verification voltage Vvfy to the selected word line and a pass voltage Vpass to one or more unselected word line(s), or word lines that were not selected by the row decoder 120. During a read operation, the row decoder 120 may transfer a selection read voltage Vrd to the selected word line and a non-selection read voltage Vread to the one or more unselected word line(s). During an erase operation, the row decoder 120 may float the ground selection lines GSL1 and GSL2 based on, for example, various delay conditions, thereby making it possible to block an unintended change in a threshold voltage of the second ground selection transistor GST2, which is programmable and is connected to a second ground selection line GSL2.

In certain embodiments, the page buffer 130 may operate as a write driver during a program operation and as a sense amplifier during a read operation. For example, during the program operation, the page buffer 130 may transfer a bit line voltage, which corresponds to data to be programmed, to a bit line of the cell array 110. During the read operation, the page buffer 130 may sense data that is stored at a selected memory cell by way of a bit line. The page buffer 130 may latch the sensed data, and may transfer the latched data to the input/output buffer 140. When programming the second ground selection transistors GST2, the page buffer 130 may perform program verification on the second ground selection transistors GST2 by the block or by the plane. This will be described with reference to the following flow chart.

During a program operation, the input/output buffer 140 may transfer received write data to the page buffer 130. During a read operation, the input/output buffer 140 may output read data that is provided from the page buffer 130 to the outside. In some embodiments, the input/output buffer 140 may transfer a received address ADD or command CMD to the control logic 150 or the row decoder 120.

The control logic 150 may control the page buffer 130 and the row decoder 120 in response to the command CMD from the outside and a control signal CNTL. For example, the control logic 150 may control the voltage generator 160 and the page buffer 130 in response to the command CMD from the outside to allow selected memory cells to be programmed or sensed. During an erase operation, the control logic 150 may control the voltage generator 160 and the row decoder 120 so as to provide a bias for preventing the erasing of the second ground selection transistor GST2. In addition, the control logic 150 may control the voltage generator 160 and the row decoder 120 so as to provide a bias for programming a plurality of second ground selection transistors GST2.

In response to a control of the control logic 150, the voltage generator 160 may generate a variety of word line voltages to be supplied to word lines and a voltage to be supplied to a bulk (e.g., a well area) where memory cells are formed. In some embodiments, word line voltages to be supplied to word lines may include the program voltage Vpgm, the pass voltage Vpass, the selection and non-selection read voltages Vrd and Vread, respectively, and the like. The voltage generator 160 may generate selection line voltages Vssl and Vgsl to be supplied to the selection lines SSL and GSL during a read or program operation. For example, when programming memory cells, the voltage generator 160 may provide voltages, which may be the same as or different from each other, to the first and second ground selection lines GSL1 and GSL2 that are connected to gates of the first and second ground selection transistors GST1 and GST2, respectively.

The nonvolatile memory device 100 of the disclosed embodiments may include a plurality of vertical NAND strings which are formed to be vertical to the substrate. In some embodiments, the nonvolatile memory device 100 may include at least one second ground selection transistor GST2, which has the same insulating layer as memory cells, and a first ground selection transistor GST1 having an oxide layer structure different from the second ground selection transistor GST2. For example, the substrate where the cell array 110 of the nonvolatile memory device 100 is formed may be a single-crystalline silicon substrate, a poly-crystalline silicon substrate, or a substrate on which a material is deposited or grown. The first ground selection transistor GST1, which is formed on the above-described poly-crystalline silicon substrate or deposited or grown on a substrate, may cause a leakage current due to defects of the grain boundary. However, it may be possible to compensate for the leakage current by programming the second ground selection transistor GST2.

Figure 2:
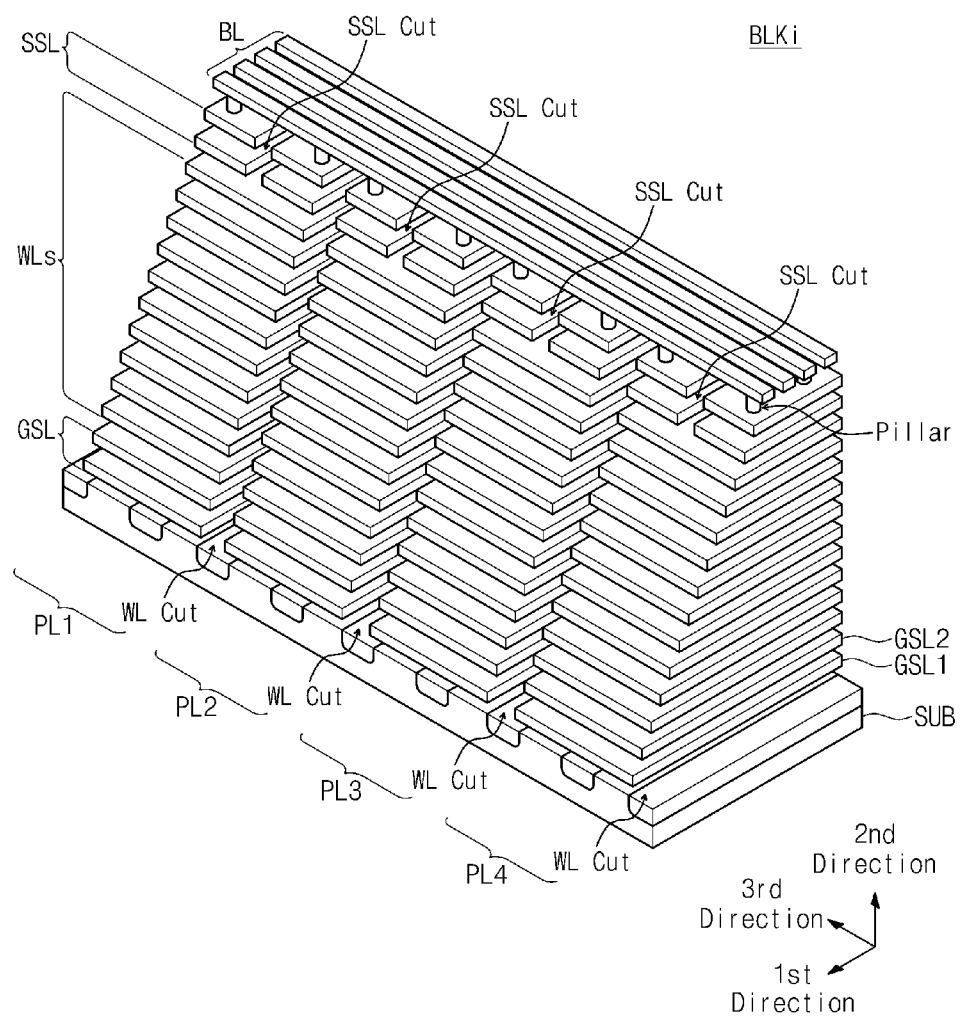
FIG. 2 is a perspective view an exemplary memory block included in a cell array illustrated in FIG. 1, according to certain disclosed embodiments.

FIG. 2 is a perspective view of one of memory blocks included in a cell array 110, such as the exemplary cell array 110 illustrated in FIG. 1. Referring to FIG. 2, a memory block BLK1 may be formed by stacking a conductive layer and an insulating layer, in turn, on a substrate SUB. The memory block BLKi may include a plurality of sets of planes PL1, PL2, PL3, and PL4. Each of the sets of planes PL1, PL2, PL3, and PL4 may be formed by stacking and cutting at least one first ground selection line GSL1, at least one second ground selection line GSL2, a plurality of word lines WL, and at least one string selection line SSL on the substrate SUB in the form of a plane. For example, different sets of planes PL1, PL2, PL3, and PL4 may be formed by cutting through, or forming a separation between, at least one first ground selection line GSL1, at least one second ground selection line GSL2, a plurality of word lines WL, and at least one string selection line SSL, which are stacked on the substrate SUB. As a result, different groups of planes may be formed, with each group including a plurality of co-planar, horizontally adjacent planes (e.g., formed at the same vertical level), separated by cut regions. A first stack of planes including a first set of planes PL1 may thus correspond with a second stack of planes including a second set of planes PL2, etc. Each set of stacked planes may include vertically aligned planes, while each group of planes at the same vertical level may correspond with each other as being cut from the same original plane. Here, the at least one string selection line SSL may be illustrated as being separated from at least one other string selection line SSL by string selection line cuts (SSL Cut). However, such a structure may be exemplary. In the case where the plate-shaped string selection line SSL is not cut by the string selection line cuts, strings may be selected through the selection of bit lines BL. As used herein, the terms "plate-shaped" or "form of a plate" may refer to a shape that is relatively shallow in height, as illustrated in the $2^{nd}$ direction of FIG. 2, while being relatively broader in width and length, as illustrated in the respective $1^{st}$ and $3^{rd}$ directions of FIG. 2. For example, certain plate-shaped components may have a width greater than 5 times the height and a length greater than 10 times the height.

In addition, at least one plate-shaped dummy word line may be placed between the second ground selection line GSL2 and the word lines WL, or at least one plate-shaped dummy word line may be placed between the word lines WL and the string selection line SSL. In some embodiments, although not illustrated, each of the word line cuts may include a common source line CSL. For example, the common source lines CSL, respectively included in the word line cuts, may be connected in common with one another. A NAND cell string may be formed by making a pillar, connected to a bit line, that penetrates the first and second ground selection lines GSL1 and GSL2, the word lines, and the string selection line SSL.

Although not illustrated, a distance between a gate pattern corresponding to the second ground selection line GSL2 and a gate pattern corresponding to the dummy word line may be different from a cell distance between word lines. Exemplarily, the distance between the gate pattern corresponding to the second ground selection line GSL2 and the gate pattern corresponding to the dummy word line may be wider than the cell distance between the word lines. Also, the distance between the gate pattern corresponding to the first ground selection line GSL1 and a gate pattern corresponding to the second ground selection line GSL2 may be different from the cell distance between the word lines.

Figure 3A:
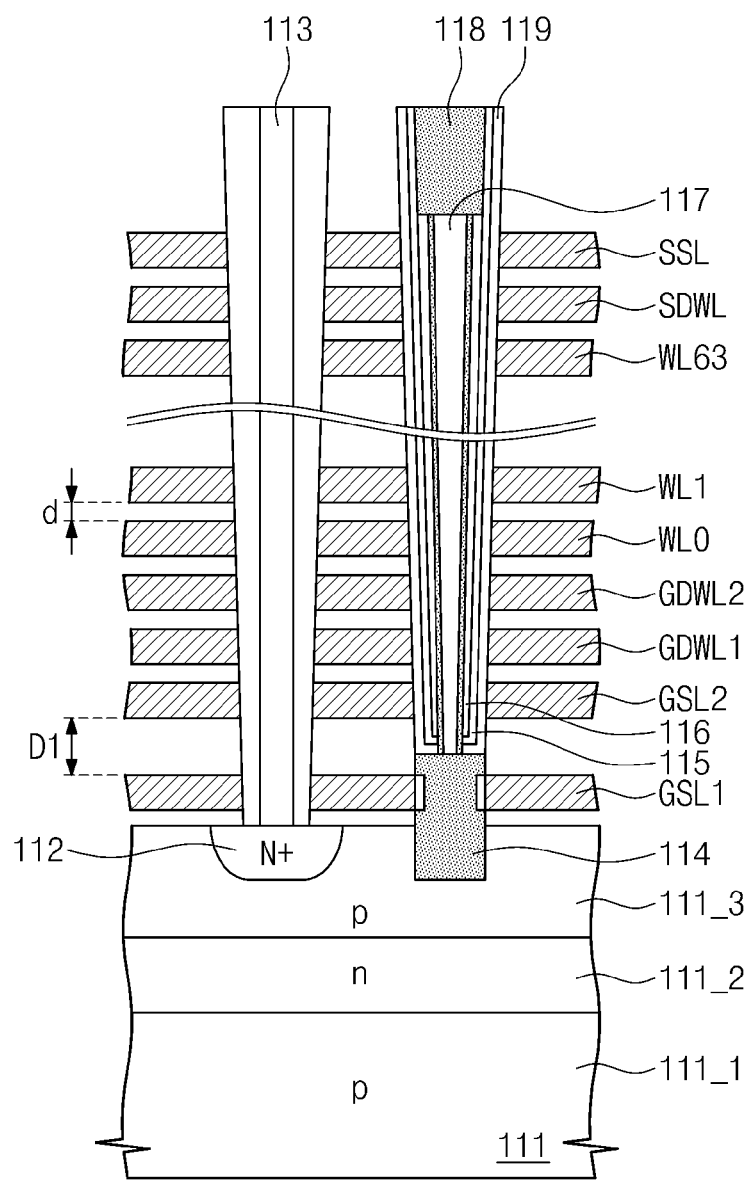
FIGS. 3A and 3B are views schematically illustrating a structure of an exemplary NAND cell string, according to certain disclosed embodiments.
Figure 3B:
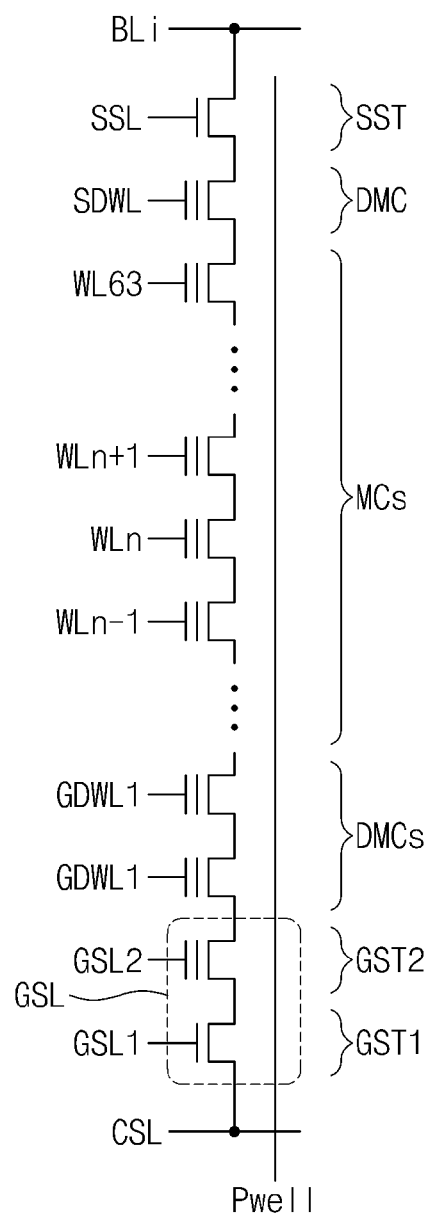

FIGS. 3A and 3B are views schematically illustrating a structure of a NAND cell string according to certain exemplary embodiments. FIG. 3A is a cross-sectional view schematically illustrating an exemplary structure of a three-dimensional semiconductor memory device. Referring to FIG. 3A, for example, a well area which is doped with dopants of a first conductivity type may be formed in a substrate 111. The substrate 111 may be a silicon substrate, a germanium substrate, or a silicon-germanium substrate. For example, the substrate 111 may be formed of poly-crystalline silicon capable of being deposited or grown.

The substrate 111 may be formed of, for example, a poly-crystalline silicon layer. The substrate 111 may include well structures, which are formed by doping the poly-crystalline silicon layer to have a first conductivity type (e.g., p-type) and a second conductivity type (e.g., n-type). For example, the well structures may include a deep well 111_2 doped to have the second conductivity type (e.g., n-type) and a base substrate 111_1 doped to have the first conductivity type (e.g., p-type). In certain embodiments, the deep well 111_2 may allow a pocket well 111_3 to be separated from the base substrate 111_1 electrically and spatially. For example, the deep well 111_2 may be formed as a layer that separates the pocket well 111_3 from the base substrate 111_1.

In certain embodiments, a stack structure, which includes insulating patterns and gate patterns stacked alternately and iteratively, may be disposed on the substrate 111. The gate patterns may be used as the ground selection lines GSL1 and GSL2, dummy word lines GDWL1, GDWL2, and GDWL3, word lines WL0 to WL63, and the string selection line SSL.

A common source plug 113 may be formed, and the common source plug 113 may be electrically connected with the pocket well 111_3 of the substrate 111. In some embodiments, the common source plug 113 may be electrically isolated from the stacked gate patterns. First dopants may be injected at a high dose into a portion 112 of the pocket well 111_3 to electrically connect the substrate 111 and the common source plug 113. A specific voltage may be provided to the pocket well 111_3 corresponding to the common source line CSL through the common source plug 113.

A vertical tube or channel 117 which penetrates gate patterns may be formed to implement a cell string, according to certain disclosed embodiments. A contact plug 118 may be formed on the vertical channel 117 and may be used as a drain of the cell string. An active pattern 114 may be formed between a bottom end portion of the vertical channel 117 and the pocket well 111_3. In some embodiment, one portion of the active pattern 114 may be formed of epitaxial layer and the other portion of the active pattern 114 may be formed of poly-crystalline silicon capable of being deposited. Insulating layers 116 and 119, a data storage layer 115, and the like may be formed between the vertical channel 117 and the gate patterns. In some embodiments, the insulating layers 116 and 119 and the data storage layer 115 may be formed of combinations of a tunnel dielectric layer, a charge storage layer, and a block dielectric layer. However, in certain embodiments, the data storage layer 115 between the active pattern 114 and the gate patterns may not exist at an area where the active pattern 114 and a gate pattern intersect. A vertical channel may be formed at an area where the first ground selection line GSL1 and the active pattern 114 intersect, and a horizontal channel may be formed at the active pattern 114 formed on the pocket well 111_3. The first ground selection transistor GST1, which is defined (or formed) by the active pattern 114 and the lowermost gate pattern, may not function to store data.

The lowermost gate pattern of the gate patterns may be used as the first ground selection line GSL1. A gate pattern positioned on the first ground selection line GSL1 may be used as the second ground selection line GSL2. For example, the second ground selection line GSL2 may be a gate pattern that is positioned above the first ground selection line GSL1. The dummy word lines GDWL1 and GDWL2, the word lines WL0 to WL63, and the dummy word line SDWL may be formed on the second ground selection line GSL2. The uppermost gate pattern may be used as the string selection line SSL. The cell array 110 may be for a vertical NAND flash memory. Gate patterns vertically stacked along one vertical channel 117 may compose one NAND cell string of cell array 110.

In some embodiments, each of a gate pattern for the first ground selection line GSL1 and a gate pattern for the second ground selection line GSL2 may be illustrated as being one layer. However, the scope and spirit of the embodiments may not be limited thereto. For example, each of a gate pattern for the first ground selection line GSL1 and a gate pattern for the second ground selection line GSL2 may be formed of two or more layers. In addition, a distance D1 between a gate pattern corresponding to the first ground selection line GSL1 and a pattern corresponding to the second ground selection line GSL2 may be different from a distance "d" between word lines WL0 through WL63 (i.e., distance "d" between WL0 and WL1, distance "d" between WL1 and WL2, distance "d" between WL2 and WL3, and so on). In some embodiments, the distance D1 between the first ground selection line GSL1 and the second ground selection line GSL2 may be greater than the distance "d" between word lines. In other embodiments, the distance D1 between the first ground selection line GSL1 and the second ground selection line GSL2 may be substantially similar to, or the same as, the distance "d" between word lines.

FIG. 3B is a circuit diagram schematically illustrating a structure of a NAND cell string formed in a stacked manner, as disclosed in the example of FIG. 3A. Referring to FIG. 3B, a NAND cell string of the disclosed embodiments may include at least one first ground selection transistor GST1, which is not capable of being programmed, and at least one second ground selection transistor GST2, which is capable of being programmed. The NAND cell string may also include memory cells MCs, dummy memory cells DMCs, a string selection transistor SST, and a well structure which are formed by doping to a first conductivity type Pwell (e.g., p-type doping). In the example embodiments of FIGS. 3A and 3B, the NAND cell string structure may provide high reliability of data in a vertical NAND flash memory which is formed on a substrate 111, for example, a substrate consisting of a material such as poly-crystalline silicon. For example, it may be possible to compensate for instability of a threshold voltage of the first ground selection transistor GST1 due to defects of the grain boundary of the substrate 111 by adjusting a threshold voltage of the second ground selection transistor GST2. In certain embodiments, the threshold voltage of the second ground selection transistor GST2 may be adjusted through programming.

Figure 4:
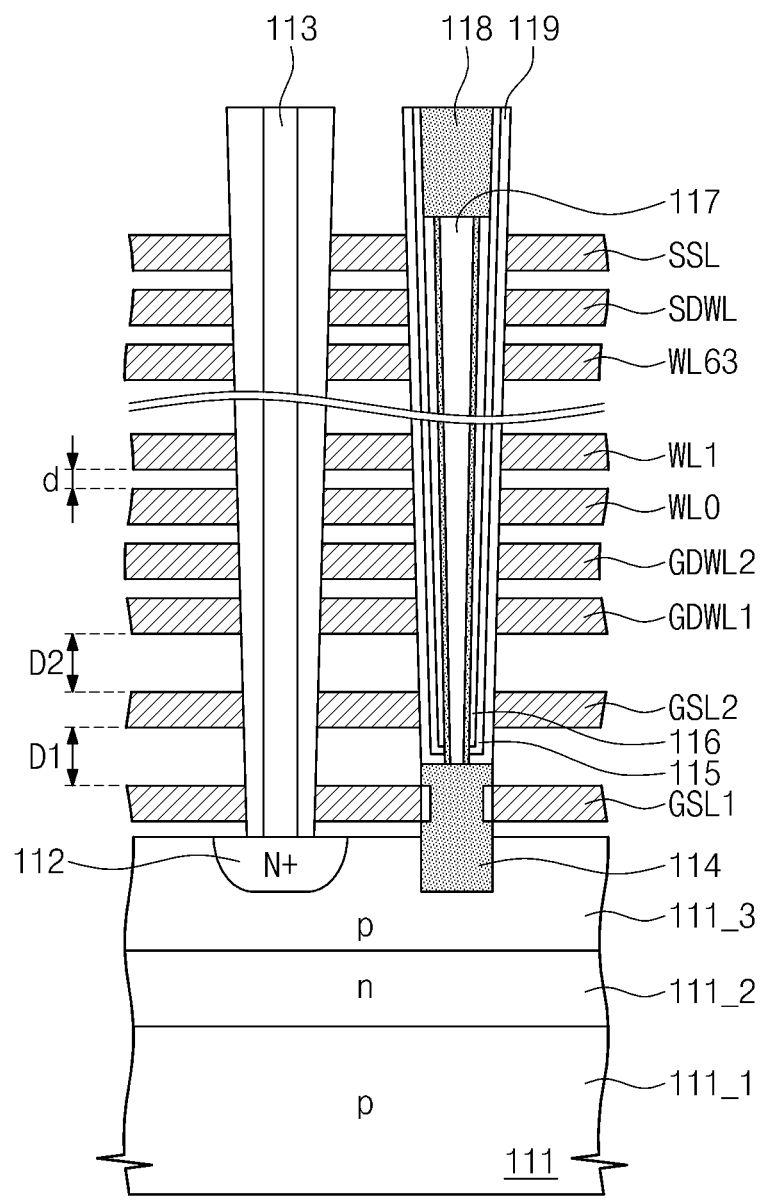
FIG. 4 is a cross-sectional view schematically illustrating a structure of an exemplary three-dimensional semiconductor memory device, according to certain disclosed embodiments.

FIG. 4 is a cross-sectional view schematically illustrating a structure of a three-dimensional semiconductor memory device according to certain exemplary embodiments. Referring to FIG. 4, a structure of a vertical NAND flash memory may be similar to that illustrated in FIG. 3A, but may be different from FIG. 3A in that a distance D2 between the second ground selection line GSL2 and the dummy gate line GDWL1 is different from a distance "d" between word lines WL0 through WL63 (i.e., distance "d" between WL0 and WL1, distance "d" between WL1 and WL2, distance "d" between WL2 and WL3, and so on). In certain embodiments, the distance D2 between the second ground selection line GSL2 and the dummy gate line GDWL1 may be greater than the distance "d" between word lines. In other embodiments, the distance D2 between the second ground selection line GSL2 and the dummy gate line GDWL1 may be similar to, or the same as, the distance "d" between word lines and/or similar to, or the same as, the distance D1 between the first ground selection line GSL1 and the second ground selection line GSL2. A structure of a vertical NAND flash memory illustrated in FIG. 4 may be similar to that illustrated in FIG. 3A except for the above-described difference(s), and a detailed description of common components illustrated in both FIGS. 3A and 4 thus may be omitted.

FIGS. 5A to 5D are views schematically illustrating exemplary wiring structures of ground selection lines for a plane of a three-dimensional NAND flash memory block, consistent with certain disclosed embodiments.

Figure 5A:
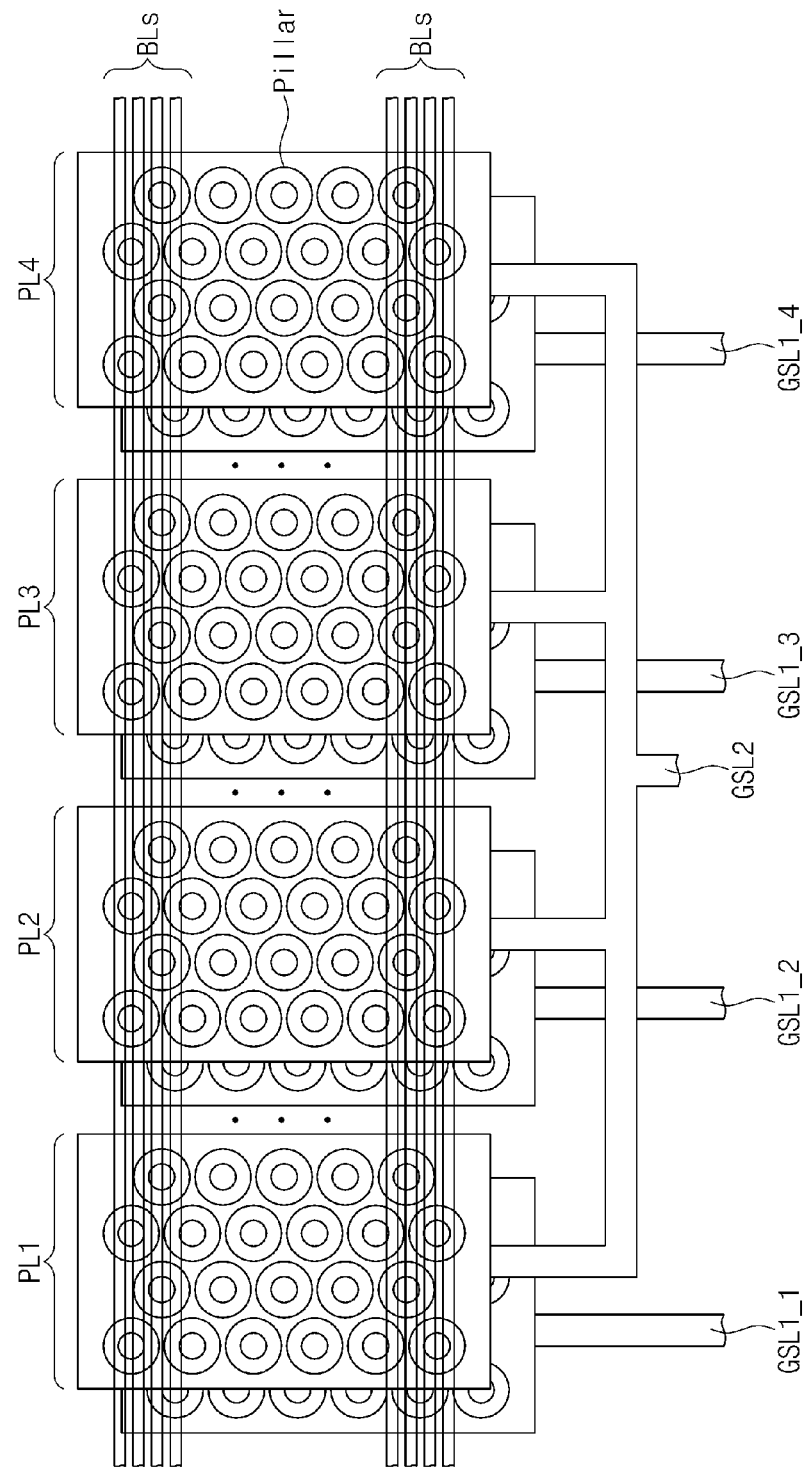
FIGS. 5A to 5D are views schematically illustrating a wiring structure of ground selection lines for a plane of an exemplary three-dimensional NAND flash memory block, according to certain disclosed embodiments.

FIG. 5A shows an exemplary structure in which the first ground selection line GSL1 is separated across a horizontal plane (e.g., first ground selection lines GSL1_1, GSL1_2, GSL1_3, and GSL1_4) and the second ground selection line GSL2 is shared across a horizontal plane. For example, in the embodiment of FIG. 5A, a first group of planes from PL1, PL2, PL3, and PL4 at the same first vertical level may share the second ground selection line GSL2 (e.g., a common ground selection line), while a second group of planes from PL1, PL2, PL3, and PL4 at the same second vertical level may include separate, dedicated ground selection lines (e.g., a plane from PL1 may include the ground selection line GSL1_1, a plane from PL2 may include the ground selection line GSL1_2, a plane from PL3 may include the ground selection line GSL1_3, and a plane from PL4 may include the ground selection line GSL1_4). A memory block in which a common source area is shared may be an erase unit. In some embodiments, a memory block in which a common source area is shared may be referred to as a minimum erase unit. A memory block may be divided into a plurality of stacked sets of planes based on a unit by which gate patterns are cut. For example, a memory block may be divided into four stacked sets of planes PL1, PL2, PL3, and PL4 (also referred to as plane sets). Ground selection lines GSLs of the respective stacked sets of planes PL1, PL2, PL3, and PL4 may be separately controlled or, alternately, shared according to a routing manner. In FIG. 5A, for example, first ground selection lines GSL1_1, GSL1_2, GSL1_3, and GSL1_4 of the respective stacked plane sets PL1, PL2, PL3, and PL4 may be separated physically and controlled individually. In another example, gate patterns corresponding to the second ground selection lines GSL2 of the stacked plane sets PL1, PL2, PL3, and PL4 may be shared by the second ground selection line GSL2.

As illustrated in FIG. 5A, bit lines BLs may be connected to vertical channels or pillars, which are arranged in the form of zigzags. In the plane structure illustrated in FIG. 5A, a verify operation for a plane on the second ground selection transistors GST2 (not shown) may be programmable. For example, during a program verify operation, when one of the first ground selection lines GSL1_1, GSL1_2, GSL1_3, and GSL1_4 is activated, it may be possible to perform program verification of the second ground selection transistors GST2 in an activated plane.

Figure 5B:
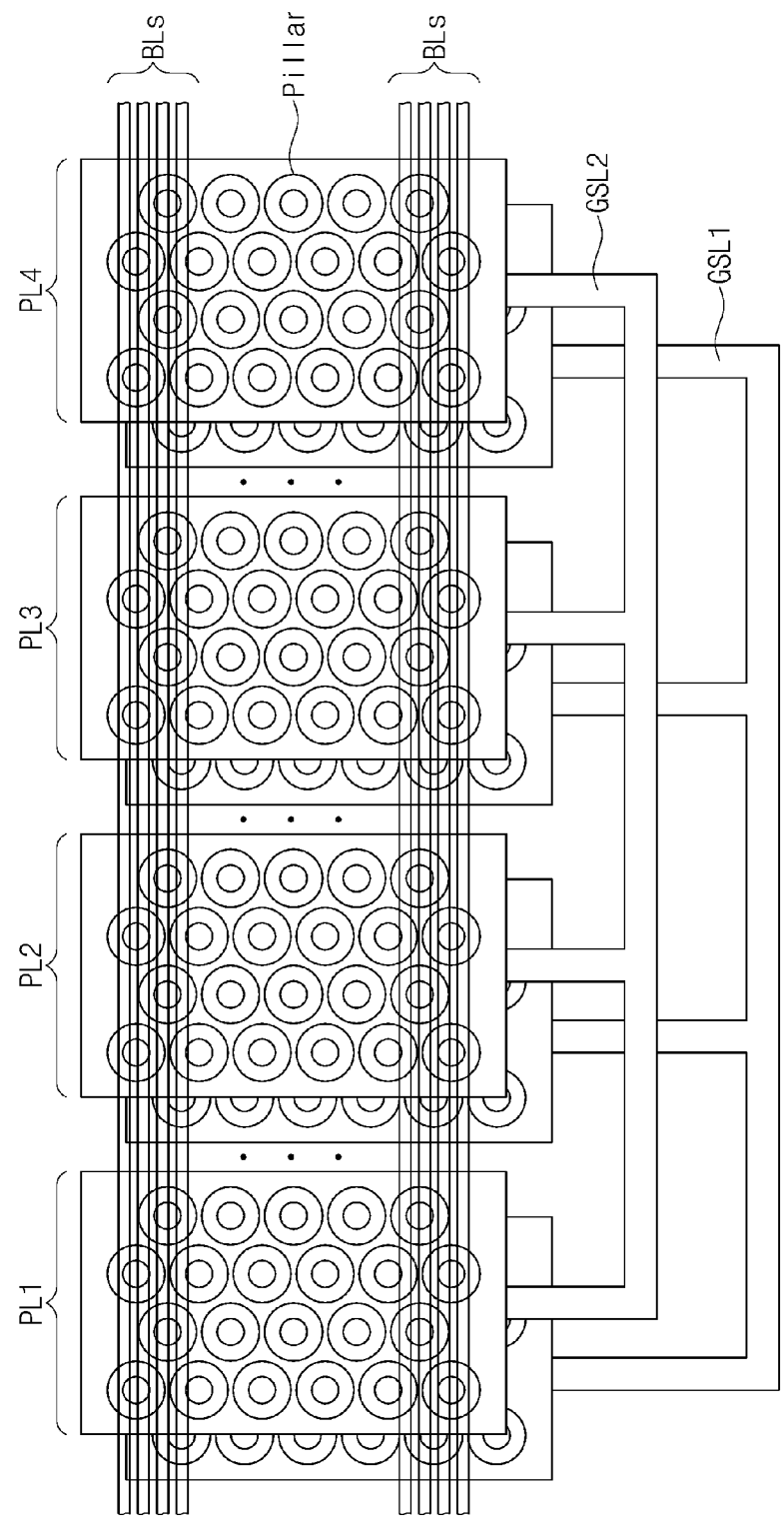

FIG. 5B shows an exemplary structure in which a first ground selection line GSL1 and a second ground selection line GSL2 may each be shared across respective horizontal planes, i.e., shared by respective groups of horizontally adjacent planes from among stacked plane sets PL1, PL2, PL3, and PL4. In this case, one or more of the ground selection transistors GST1 and GST2 (not shown in FIG. 5B) of the respective planes from among sets of plane sets PL1, PL2, PL3, and PL4 may be managed the same. For example, because of the zig-zagged arrangement of the vertical channels or pillars, the first ground selection transistor GST1 of a plane from the first plane set PL1 may be driven by the same control signal as the first ground selection transistor GST1 of a horizontally adjacent plane from the third plane set PL3. In the exemplary plane structure illustrated in FIG. 5B, it may not be possible for a verify operation for a plane on the second ground selection transistor GST2 to be programmable. For example, during a program verify operation, program verifying of the second ground selection transistor GST2 may be performed by the block.

Figure 5C:
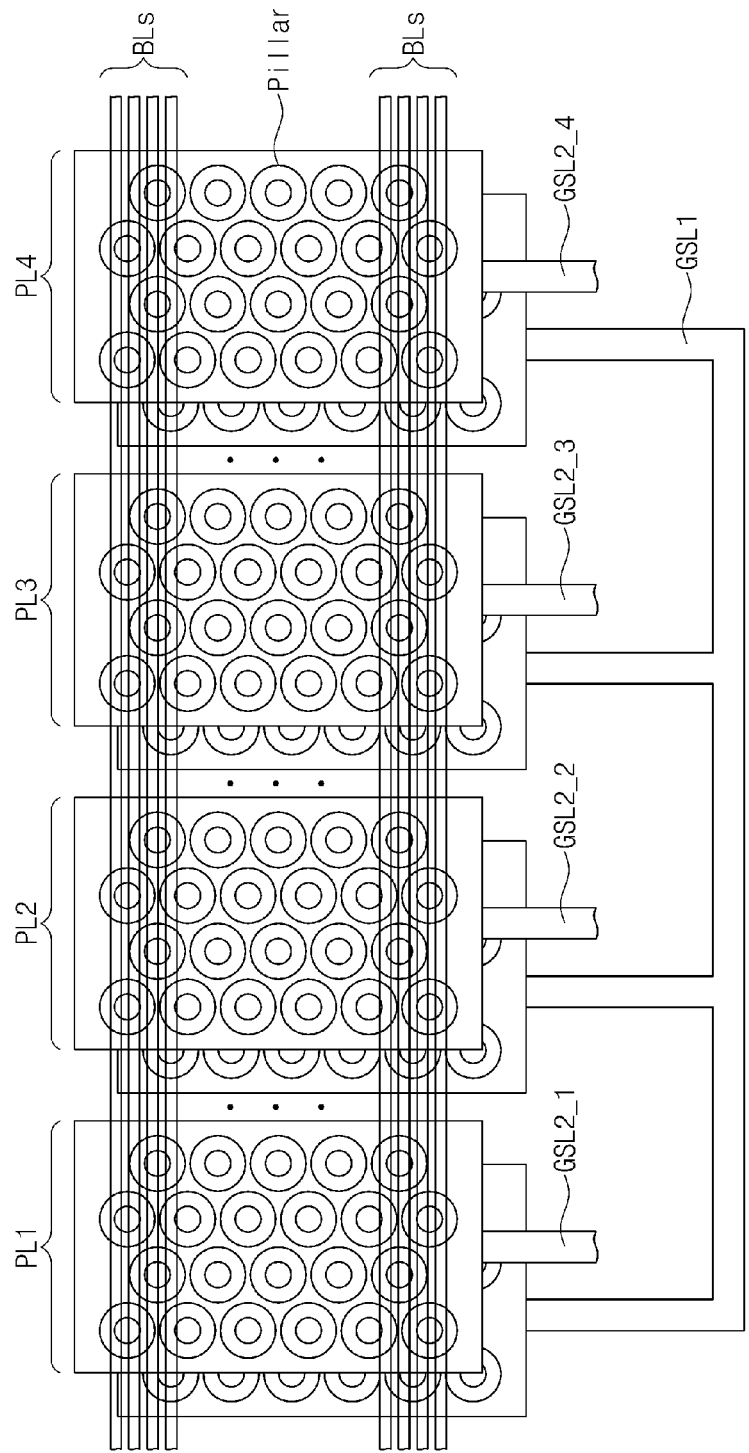

FIG. 5C shows an exemplary structure in which the first ground selection line GSL1 may be shared across horizontal planes, i.e., shared by a group of planes from among the stacked plane sets PL1, PL2, PL3, and PL4, and the second ground selection line GSL2 is separated across a horizontal plane (e.g., second ground selection lines GSL2_1, GSL2_2, GSL2_3, and GSL2_4). For example, in the embodiment of FIG. 5C, a first group of horizontally adjacent planes from among the stacked plane sets PL1, PL2, PL3, and PL4 may share the first ground selection line GSL1, while a second group of horizontally adjacent planes from among the stacked plane sets PL1, PL2, PL3, and PL4 may include separate dedicated ground selection lines (e.g., GSL2_1, GSL2_2, GSL2_3, and GSL2_4). Ground selection lines of the first group of horizontally adjacent planes may be controlled in common, while ground selection lines of the second group of horizontally adjacent planes may be controlled individually and separately. In another example, gate patterns corresponding to the second ground selection lines GSL1 may be shared by the second ground selection line GSL1. As illustrated in FIG. 5C, bit lines BLs may be connected to vertical channels or pillars, which are arranged in the form of zigzags. For example, during a program verify operation, when one of the second ground selection lines GSL2_1, GSL2_2, GSL2_3, and GSL2_4 is activated, it may be possible to perform program verification of the second ground selection transistors GST2 in an activated stacked plane.

Figure 5D:
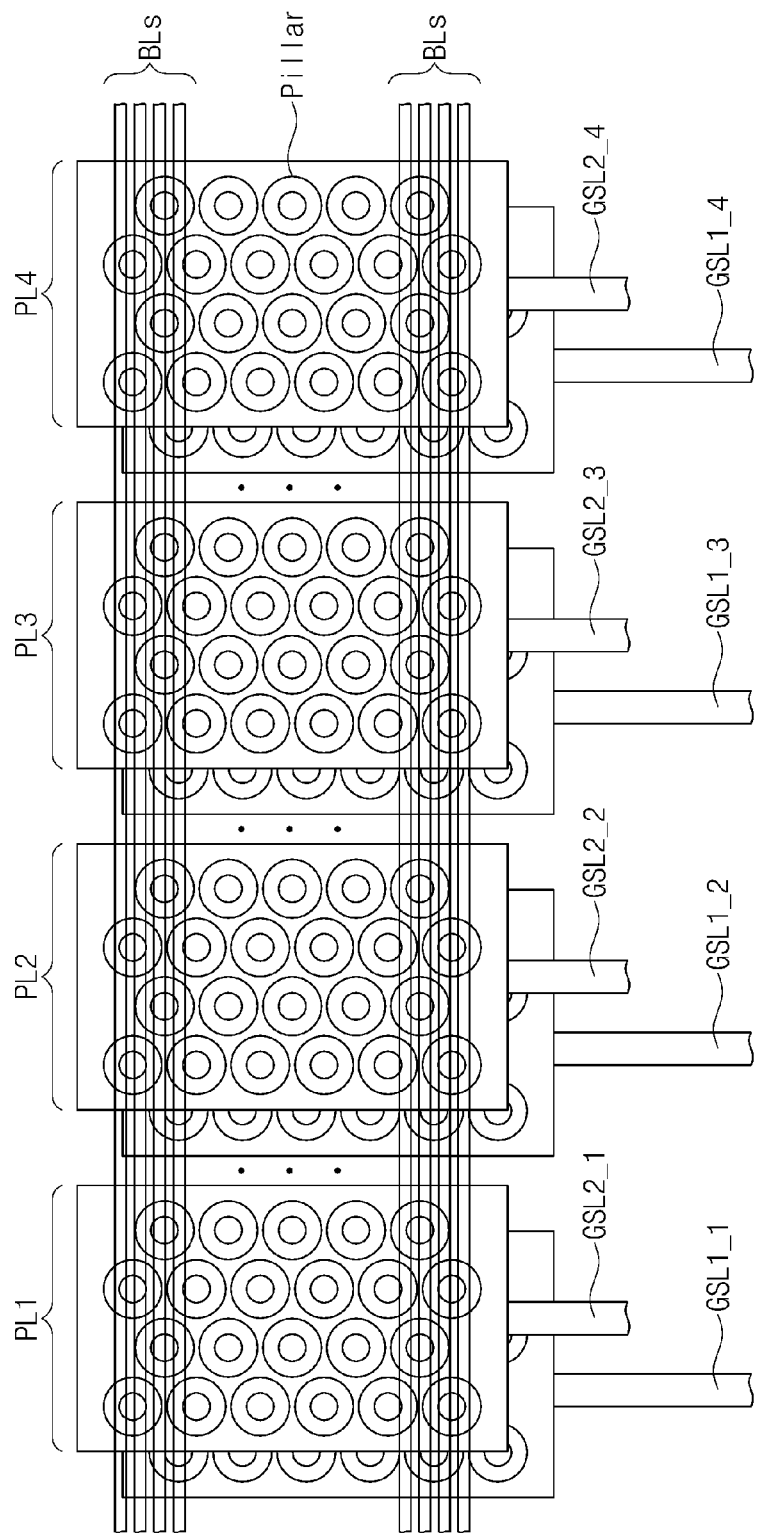

FIG. 5D shows an exemplary structure in which the first ground selection line GSL1 is separated across a horizontal plane (e.g., first ground selection lines GSL1_1, GSL1_2, GSL1_3, and GSL1_4), and the second ground selection line GSL2 is separated across a horizontal plane (e.g., GSL2_1, GSL2_2, GSL2_3, and GSL2_4). For example, in the embodiment of FIG. 5D, plane set PL1 may include the first ground selection line GSL1_1 and the second ground selection line GSL2_1, plane set PL2 may include the first ground selection line GSL1_2 and the second ground selection line GSL2_2, plane set PL3 may include the first ground selection line GSL1_3 and the second ground selection line GSL2_3, and plane set PL4 may include the first ground selection line GSL1_4 and the second ground selection line GSL2_4. In the exemplary embodiment of FIG. 5D, ground selection lines GSL1 and GSL2 of the respective plane sets PL1, PL2, PL3, and PL4 may be separately controlled. In FIG. 5D, for example, first ground selection lines GSL1_1, GSL1_2, GSL1_3, and GSL1_4 of the respective plane sets PL1, PL2, PL3, and PL4 may be separated physically and controlled individually, and second ground selection lines GSL2_1, GSL2_2, GSL2_3, and GSL2_4 of the respective plane sets PL1, PL2, PL3, and PL4 may be separated physically and controlled individually. As illustrated in FIG. 5D, bit lines BLs may be connected to vertical channels or pillars, which are arranged in the form of zigzags.

In the embodiments of FIGS. 5A to 5D, there is described an exemplary plane interconnection structure of NAND cell strings each having the first ground selection transistor GST1, which does not include a charge storage layer, and the second ground selection transistor GST2, which is programmable. In the disclosed embodiments, an interconnection structure of the first ground selection line GSL1 for controlling the first ground selection transistor GST1 and the second ground selection line GSL2 for controlling the second ground selection transistor GST2 may be variously changed or modified.

Figure 6:
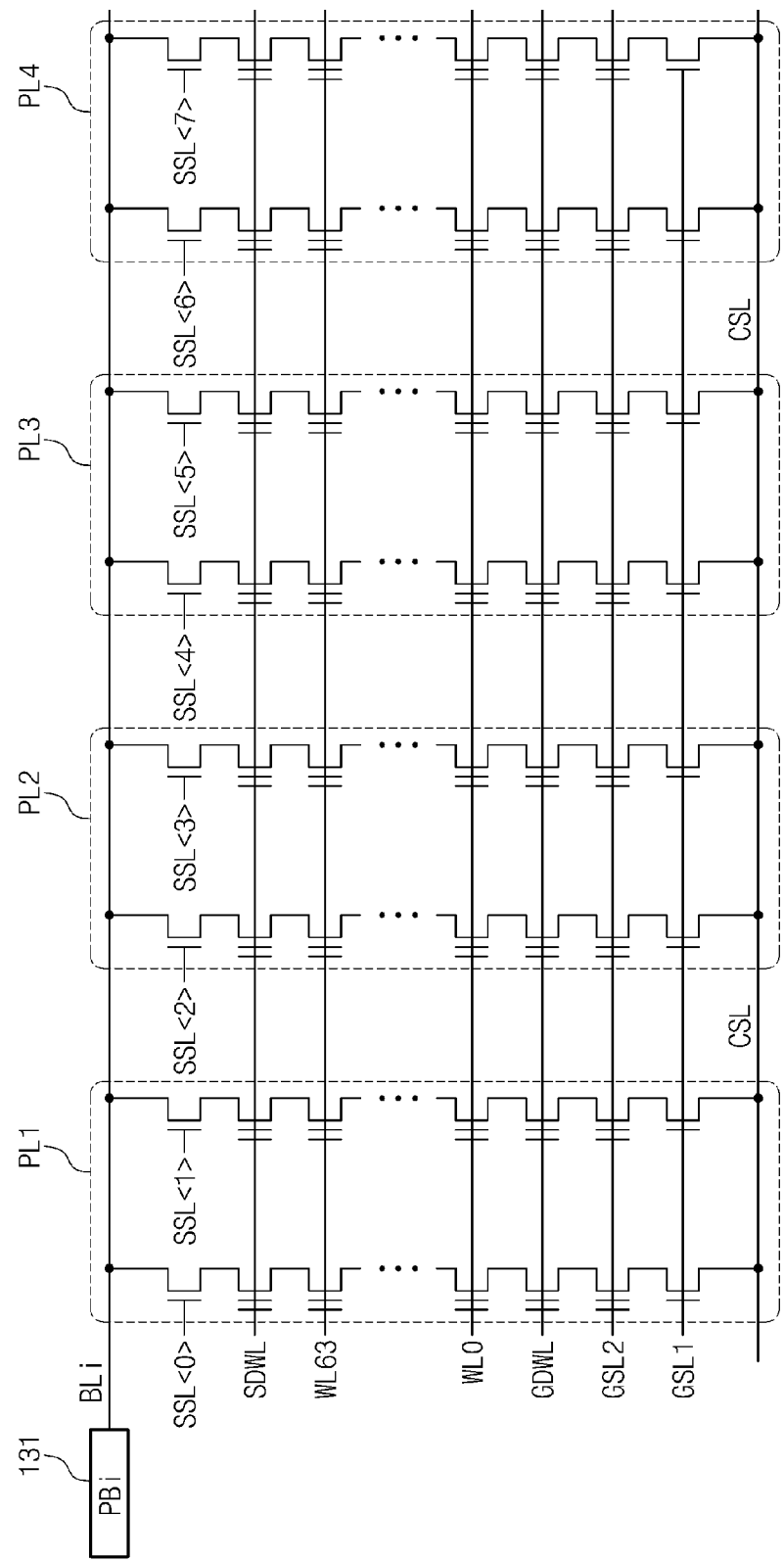
FIG. 6 is a circuit diagram schematically illustrating an exemplary connection structure of first and second ground selection lines of a plane unit, according to certain disclosed embodiments.

FIG. 6 is a circuit diagram schematically illustrating a connection structure of first and second ground selection lines GSL1 and GSL2 of a plane unit, such as, for example, plane units exemplified by stacked plane sets PL1, PL2, PL3, or PL4, according to certain disclosed embodiments. Referring to FIG. 6, cell strings may be connected as illustrated in FIG. 5B and further be connected with a page buffer PB 131. In the example of FIG. 6, NAND cell strings may be connected with a bit line BLi, as described herein. In FIG. 6, a first ground selection line GSL1 and a second ground selection line GSL2 may be shared across horizontal planes, i.e., shared by respective stacked plane sets PL1, PL2, PL3, and PL4. For example, gate lines of the first ground selection transistors GST1 of the stacked plane sets PL1, PL2, PL3, and PL4 may be controlled in common by the first ground selection line GSL1. Gate lines of the second ground selection transistors GST2 of the stacked plane sets PL1, PL2, PL3, and PL4 may be controlled in common by the second ground selection line GSL2.

In the structure illustrated by FIG. 6, it may be easy to verify whether the second ground selection transistors GST2 of the stacked plane sets PL1, PL2, PL3, and PL4 are programmed to have a voltage higher than or equal to a specific threshold voltage, on a plane unit by plane unit basis. For example, during program verifying, whether the second ground selection transistors GST2 of a memory block all are on-cell or off-cell may be detected through the page buffer 131. As used herein and with reference to FIG. 6, the term "plane unit" may refer to NAND cell strings that share a string selection line, e.g., SSL0, SSL1, SSL2, SSL3, SSL4, SSL5, SSL6, SSL7, etc. Thus, in some embodiments, a plane unit defined by PL1 may include NAND cell strings connected to string selection lines SSL0 and SSL1, a plane unit defined by PL2 may include NAND cell strings connected to string selection lines SSL2 and SSL3, a plane unit defined by PL3 may include NAND cell strings connected to string selection lines SSL4 and SSL5, and a plane unit defined by PL4 may include NAND cell strings connected to string selection lines SSL6 and SSL7.

Figure 7:
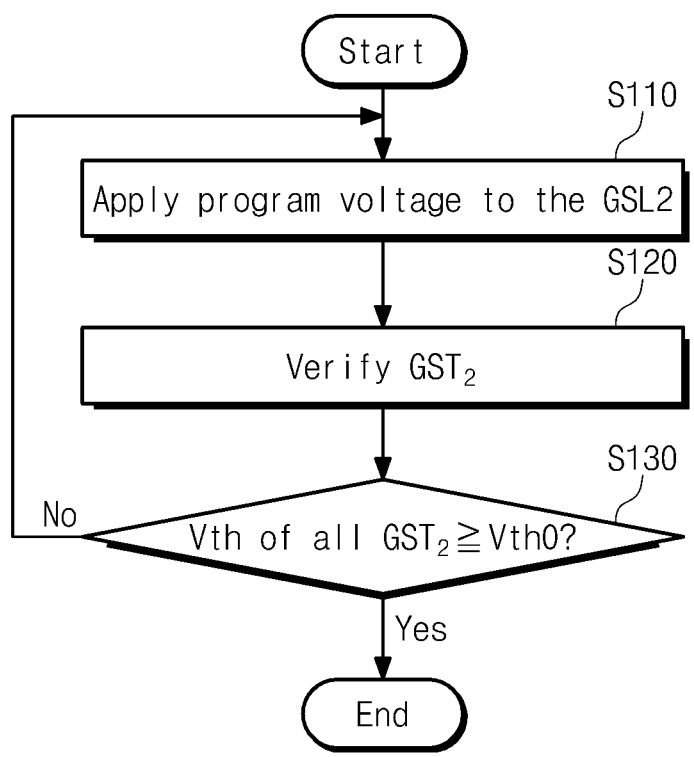
FIG. 7 is a flow chart schematically illustrating a method of programming a second ground selection transistor of an exemplary memory block in which ground selection transistors may be controlled according to a structure illustrated in FIG. 6, consistent with certain disclosed embodiments.

FIG. 7 is a flow chart illustrating an exemplary method of programming a second ground selection transistor GST2 of a memory block BLK in which ground selection transistors GST are controlled according to an exemplary structure such as, for example, the structure illustrated in FIG. 6. Referring to FIG. 7, in some embodiments, the second ground selection transistors GST2 of cell strings connected to one bit line BLi may be simultaneously programmed and simultaneously verified.

In step S110, a program voltage may be applied to gates of the programmable second ground selection transistors GST2 of a selected memory block BLK through the second ground selection line GSL2. In some embodiments, a page buffer PB may apply a ground voltage Vss or a voltage of 0 V to a bit line BL of the selected memory block BLK. A pass voltage Vpass may be applied to the dummy word lines GDWL and SDWL and the word lines WL0 to WL63. A ground voltage Vss or 0 V may be applied to the first ground selection line GSL1.

In step S120, threshold voltages of the second ground selection transistors GST2 that are programmed may be verified. In some embodiments, whether threshold voltages of the programmed second ground selection transistors GST2 are greater than or equal to a target level may be verified. For example, a verify voltage Vth0 corresponding to a target threshold voltage may be applied to the second ground selection line GSL2 of the selected memory block. The non-selection read voltage Vread may be applied to the string selection line SSL, the dummy word lines GDWL and SDWL, the word lines WL0 to WL63, and the first ground selection line GSL1. At this time, the page buffer PB may detect a change in a pre-charge voltage of a bit line and may determine whether an on-cell condition exists. An on-cell may be determined when Vth of a GST2 is less than Vth0, and an off-cell may be determined when Vth of a GST2 is greater than or equal to Vth0.

In step S130, if it is determined that a threshold voltage of one of the programmed second ground selection transistors GST2 is lower than the target threshold voltage Vth0, charges pre-charged on the bit line BL may be discharged to the common source line CSL. If at least one GST2 on-cell is detected through respective page buffers PB (step S130, No), the method may proceed to step S110. In contrast, when all the second ground selection transistors GST2 verified are determined as being an off-cell (step S130, Yes), the method may end.

Figure 8:
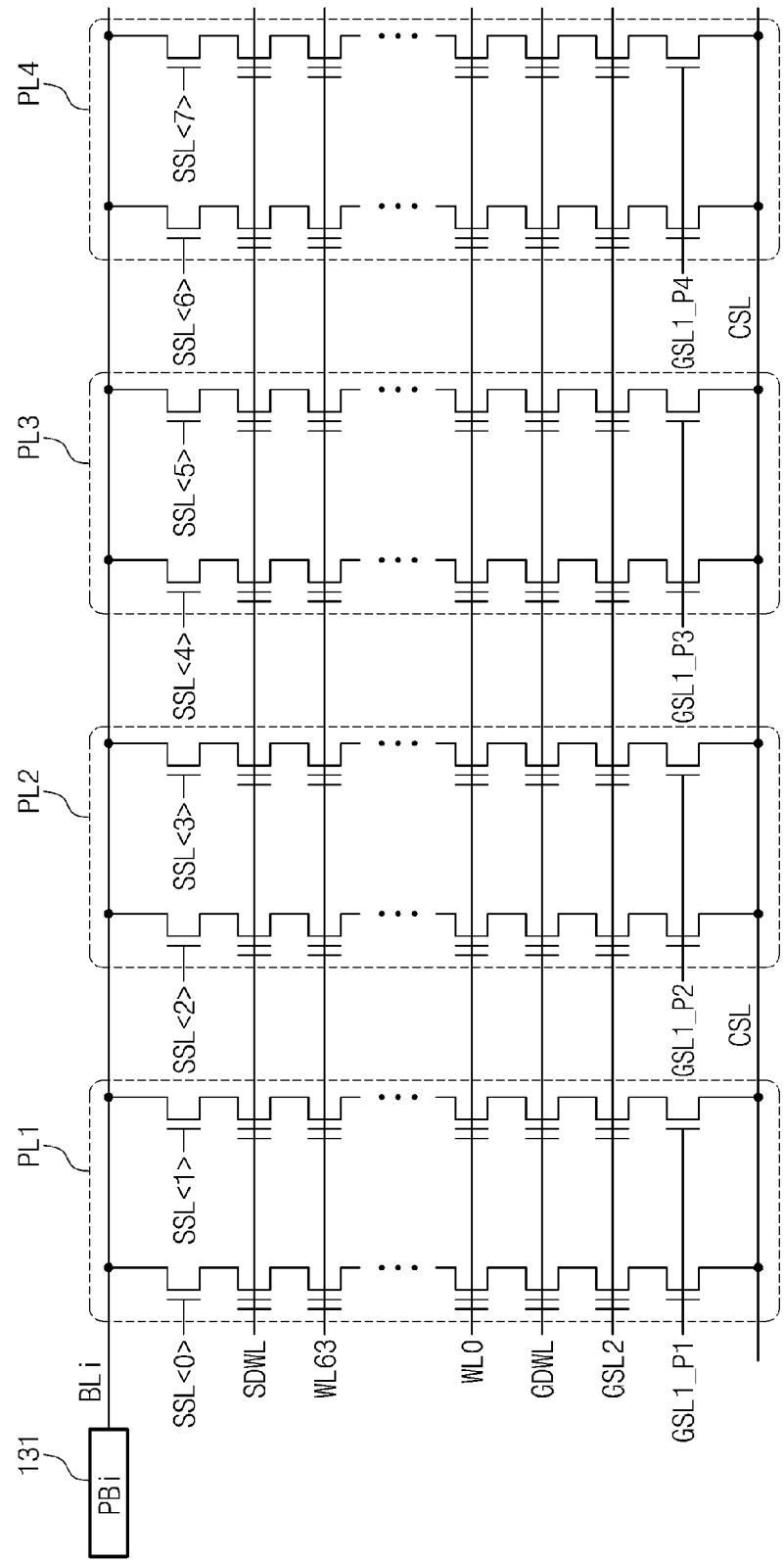
FIG. 8 is a circuit diagram schematically illustrating a connection structure of second ground selection lines of a plane unit, according to certain disclosed embodiments.

FIG. 8 is a circuit diagram schematically illustrating a connection structure of second ground selection lines GSL2 of a plane unit, such as, for example, the plane units exemplified by stacked plane sets PL1, PL2, PL3, or PL4, according to certain disclosed embodiments. Referring to FIG. 8, there may be illustrated cell strings such as, for example, those cell strings illustrated in FIG. 5A, and the page buffer PB 131.

Gate lines of the second ground selection transistors GST2 of the stacked plane sets PL1, PL2, PL3, and PL4 may be controlled in common by the second ground selection line GSL2. Gate lines of the first ground selection transistors GST1 of the stacked plane sets PL1, PL2, PL3, and PL4 may be separated, thereby providing for independent control of the first ground selection transistors GST1 of each of respective stacked plane sets PL1, PL2, PL3, and PL4. Thus, for example, the first ground selection transistor GST1 of the first stacked plane set PL1 may be controlled by a ground selection line GSL1_P1; the first ground selection transistor GST1 of the second stacked plane set PL2 may be controlled by a ground selection line GSL1_P2; the first ground selection transistor GST1 of the third stacked plane set PL3 may be controlled by a ground selection line GSL1_P3; and the first ground selection transistor GST1 of the fourth stacked plane set PL4 may be controlled by a ground selection line GSL1_P4. Different ground selection lines may receive different, independent control signals.

In the above-described exemplary structure, a verify operation may be performed by the stacked plane sets when the second ground selection transistors GST2 of the respective stacked plane sets PL1, PL2, PL3, and PL4 are programmed to have a voltage greater than or equal to a specific threshold voltage. For example, a verify operation may be performed by the respective stacked plane sets PL1, PL2, PL3, and PL4 by driving the first ground selection lines GSL1_PL1, GSL1_PL2, GSL1_PL3, and GSL1_PL4 during program verifying.

Figure 9:
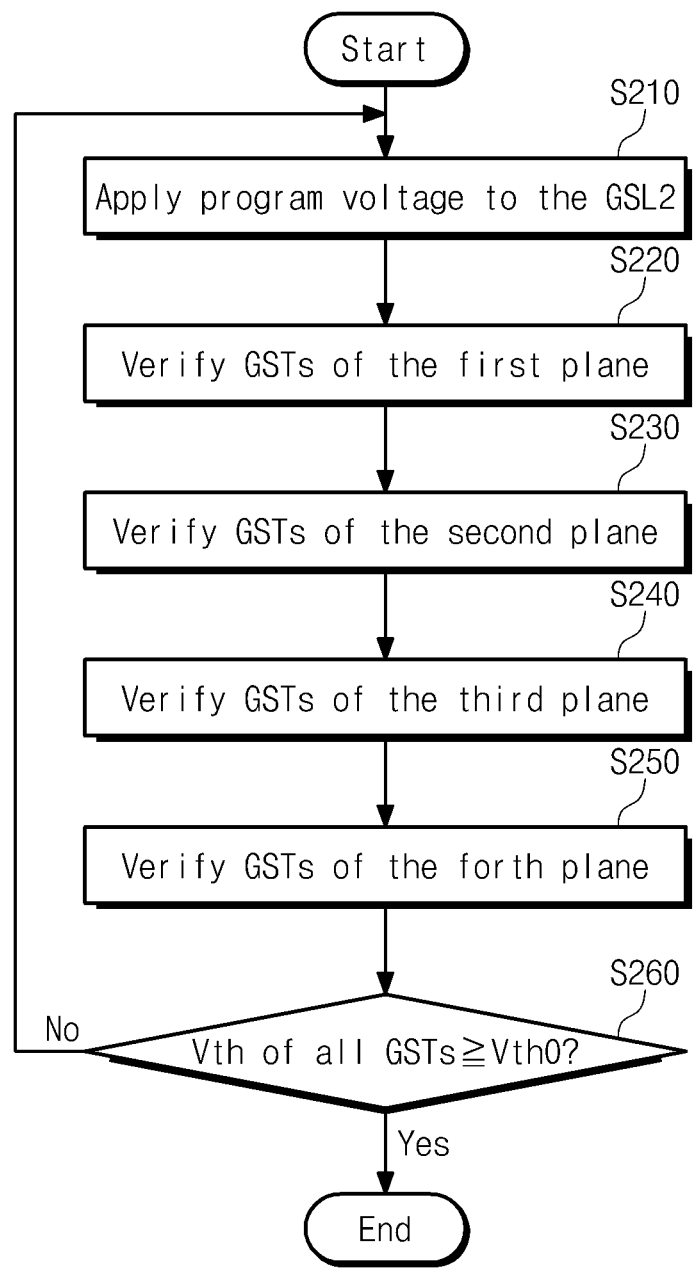
FIG. 9 is a flow chart schematically illustrating a method of programming second ground selection transistors in an exemplary memory block having a structure illustrated in FIG. 8, according to certain disclosed embodiments.

FIG. 9 is a flow chart illustrating an exemplary method of programming second ground selection transistors GST2 in a memory block having a structure according to certain embodiments, such as, for example, the structure illustrated in FIG. 8. Referring to FIG. 9, program verification may be performed by a stacked plane set PL1, PL2, PL3, or PL4 through the respective first ground selection lines GSL1_PLi (i.e., GSL1_PL1, GSL1_PL2, GSL1_PL3, or GSL1_PL4), each which is capable of being controlled for the respective stacked plane set, i.e., PLi.

In step S210, a program voltage may be applied to gates of the programmable second ground selection transistors GST2 of a selected memory block BLK through the second ground selection line GSL2. In this case, the page buffer PB may apply a ground voltage Vss or a voltage of 0 V to a bit line(s) of the selected memory block BLK. The pass voltage Vpass may be applied to the dummy word lines GDWL and SDWL and the word lines WL0 to WL63. The ground voltage Vss or a voltage of 0 V may be applied to the first ground selection line GSL1.

In step S220, a threshold voltage of the second ground selection transistor GST2 included in the first stacked plane set PL1 may be verified to determine whether it is programmed to be greater than or equal to a target threshold voltage level. For example, a verify voltage Vth0, which corresponds to a target threshold voltage, may be applied to the second ground selection line GSL2 of the selected memory block BLK. The non-selection read voltage Vread may be applied to the string selection line SSL, the dummy word lines GDWL and SDWL, and the word lines WL0 to WL63, and the first ground selection line GSL1_P1 connected to the first stacked plane set PL1. In contrast, the ground voltage Vss or a voltage of 0 V may be applied to the first ground selection lines GSL1_P2, GSL1_P3, and GSL1_P4, which are respectively connected to the second through fourth stacked plane sets PL2, PL3, and PL4. In this case, the page buffer PB may detect a change in a pre-charge voltage on a bit line(s) and may determine whether an on-cell exists in the second ground selection transistor GST2 of first stacked plane set PL1.

In step S230, a threshold voltage of the second ground selection transistor GST2 included in the second stacked plane set PL2 may be verified to determine whether it is programmed to be greater than or equal to the target threshold voltage level. For example, the verify voltage Vth0, which corresponds to the target threshold voltage, may be applied to the second ground selection line GSL2 of the selected memory block BLK. The non-selection read voltage Vread may be applied to the string selection line SSL, the dummy word lines GDWL and SDWL, and the word lines WL0 to WL63 and the first ground selection line GSL1_P2 connected to the second stacked plane set PL2. In contrast, the ground voltage Vss or a voltage of 0 V may be applied to the first ground selection lines GSL1_P1, GSL1_P3, and GSL1_P4, which are respectively connected to the first, third and fourth stacked plane sets PL1, PL3, and PL4. In this case, the page buffer PB may detect a change in a pre-charge voltage on a bit line(s) and may determine whether an on-cell exists in the second ground selection transistor GST2 of the second stacked plane set PL2.

In step S240, a threshold voltage of the second ground selection transistor GST2 included in the third stacked plane set PL3 may be verified to determine whether it is programmed to be greater than or equal to the target threshold voltage level. For example, the verify voltage Vth0, which corresponds to the target threshold voltage, may be applied to the second ground selection line GSL2 of the selected memory block BLK. The non-selection read voltage Vread may be applied to the string selection line SSL, the dummy word lines GDWL and SDWL, and the word lines WL0 to WL63 and the first ground selection line GSL1_P3 connected to the third stacked plane set PL3. In contrast, the ground voltage Vss or a voltage of 0 V may be applied to the first ground selection lines GSL1_P1, GSL1_P2, and GSL1_P4, which are respectively connected to the first, second and fourth stacked plane sets PL1, PL2, and PL4. In this case, the page buffer PB may detect a change in a pre-charge voltage on a bit line(s) and may determine whether an on-cell exists in the second ground selection transistor GST2 of the third stacked plane set PL3.

In step S250, a threshold voltage of the second ground selection transistor GST2 included in the fourth stacked plane set PL4 may be verified to determine if it is programmed to be greater than or equal to the target threshold voltage level. For example, the verify voltage Vth0, which corresponds to the target threshold voltage, may be applied to the second ground selection line GSL2 of the selected memory block BLK. The non-selection read voltage Vread may be applied to the string selection line SSL, the dummy word lines GDWL and SDWL, and the word lines WL0 to WL63 and the first ground selection line GSL1_P4 connected to the fourth stacked plane set PL4. In contrast, the ground voltage Vss or a voltage of 0 V may be applied to the first ground selection lines GSL1_P1, GSL1_P2, and GSL1_P3, which are respectively connected to the first, second and third stacked plane sets PL1, PL2, and PL3. In this case, the page buffer PB may detect a change in a pre-charge voltage on a bit line(s) and may determine whether an on-cell exists in the second ground selection transistor GST2 of the fourth stacked plane set PL4.

In step S260, threshold voltages of the programmed second ground selection transistors GST2 of the stacked plane sets PL1 to PL4 may be verified to determine whether they are lower than the target threshold voltage Vth0. If at least one of stacked plane sets PL1 to PL4 is determined to include a second ground selection transistor GST2 corresponding to an on-cell (step S260, No), the method proceeds to step S210. In contrast, if all stacked plane sets PL1 to PL4 are determined as not including a second ground selection transistor GST2 corresponding to an on-cell (step S260, Yes), the method may end.

Figure 10:
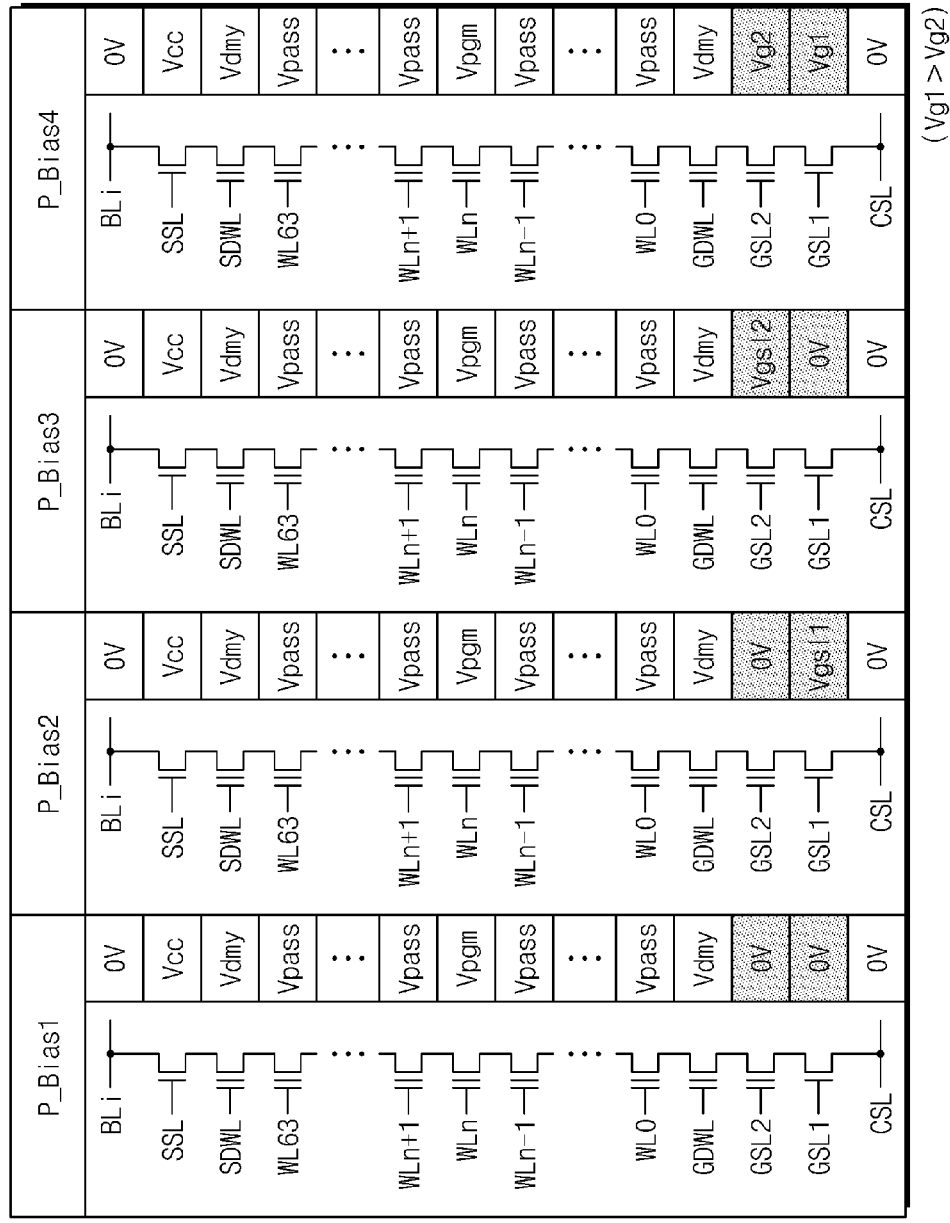
FIG. 10 is a table illustrating an exemplary bias method for programming selected memory cells of cell strings each including different kinds of ground selection transistors, according to certain disclosed embodiments.

FIG. 10 is a table illustrating an exemplary bias method for programming selected memory cells of cell strings each including both non-programmable ground selection transistors GST1 and programmable ground selection transistors GST2, according to some embodiments. Referring to FIG. 10, when programming selected memory cells, a bias method on the ground selection lines GSL1 and GSL2 may be classified into four bias manners.

According to a first bias manner P_Bias1, a ground voltage Vss or a voltage of 0 V may be applied to a bit line BLi, a power supply voltage Vcc to the string selection line SSL, and a dummy voltage Vdmy to the dummy word lines SDWL and GDWL. The pass voltage Vpass may be applied to unselected word lines WL0 to WLn−1 and WLn+1 to WL63, a program voltage Vpgm may be applied to WLn, and the ground voltage Vss may be applied to the common source line CSL. In addition, the same voltage level (e.g., the ground voltage Vss or the voltage of 0 V) may be applied to the first ground selection line GSL1, which is connected to gates of the first ground selection transistors GST1, and the second ground selection line GSL2. Here, a level of the dummy voltage Vdmy may be the same as that of the pass voltage Vpass.

According to a second bias manner P_Bias2, the ground voltage Vss or the voltage of 0 V may be applied to the bit line BLi, the power supply voltage Vcc to the string selection line SSL, and the dummy voltage Vdmy to the dummy word lines SDWL and GDWL. The pass voltage Vpass may be applied to unselected word lines WL0 to WLn−1 and WLn+1 to WL63, a program voltage Vpgm may be applied to WLn, and the ground voltage Vss may be applied to the common source line CSL. A first selection voltage Vgsl1 may be provided to the first ground selection line GSL1, which is connected to gates of the first ground selection transistors GST1. The ground voltage Vss or the voltage of 0 V may be provided to the second ground selection line GSL2, which is connected to gates of the second ground selection transistors GST2.

According to a third bias manner P_Bias3, the ground voltage Vss or the voltage of 0 V may be applied to the bit line BLi, the power supply voltage Vcc to the string selection line SSL, and the dummy voltage Vdmy to the dummy word lines SDWL and GDWL. The pass voltage Vpass may be applied to the unselected word lines WL0 to WLn−1 and WLn+1 to WL63, a program voltage Vpgm may be applied to WLn, and the ground voltage Vss may be applied to the common source line CSL. The ground voltage Vss or the voltage of 0 V may be provided to the first ground selection line GSL1, which is connected to gates of the first ground selection transistors GST1. A second selection voltage Vgsl2 may be provided to the second ground selection line GSL2, which is connected to gates of the second ground selection transistors GST2. Here, the first selection voltage Vgsl1 or the second selection voltage Vgsl2 may be a positive voltage. However, the disclosed embodiments are not limited thereto. For example, the first selection voltage Vgsl1 or the second selection voltage Vgsl2 may be a negative voltage, if appropriate.

According to a fourth bias manner P_Bias4, the ground voltage Vss or the voltage of 0 V may be applied to the bit line BLi, the power supply voltage Vcc to the string selection line SSL, and the dummy voltage Vdmy to the dummy word lines SDWL and GDWL. The pass voltage Vpass may be applied to the unselected word lines WL0 to WLn−1 and WLn+1 to WL63, a program voltage Vpgm may be applied to WLn, and the ground voltage Vss may be applied to the common source line CSL. A first voltage Vg1 may be provided to the first ground selection line GSL1, which is connected to gates of the first ground selection transistors GST1. A second voltage Vg2 may be provided to the second ground selection line GSL2, which is connected to gates of the second ground selection transistors GST2. Here, a level of the first voltage Vg1 may be higher than that of the second voltage Vg2.

Figure 11:
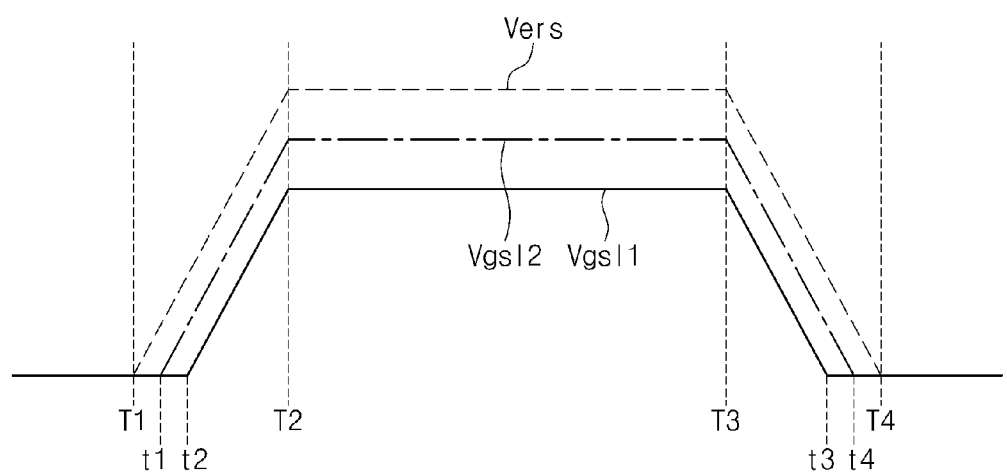
FIG. 11 is a waveform diagram schematically illustrating an exemplary erase method of a nonvolatile memory device, according to certain disclosed embodiments.

FIG. 11 is a waveform diagram schematically illustrating an erase method of a nonvolatile memory device, according to certain exemplary embodiments. Referring to FIG. 11, during an erase operation, the first ground selection line GSL1 and the second ground selection line GSL2 may be floated at a point in time which is delayed by a specific time from a point in time when an erase voltage Vers is applied. For example, an erase voltage Vers may be applied at time T1. Subsequently, at time t1, the first ground selection line GSL1 may be floated and, at time t2, the second ground selection line GSL2 may be floated.

The erase voltage Vers may be applied to a pocket well of the cell array 110 at time T1 and may increase at a consistent rate until time T2. However, a ground level Vss of the first and second ground selection lines GSL1 and GSL2 may be maintained until time t1. Next, the first ground selection line GSL1 may be floated at time t2. In this case, a voltage Vgsl2 of the second ground selection line GSL2 may increase due to capacitive coupling starting at time t1, and a voltage Vgsl1 of the first ground selection line GSL1 may increase due to capacitive coupling starting at time t2.

From T2 until time T3, voltage levels Vgsl1 and Vgsl2 of the first and second ground selection lines GSL1 and GSL2, respectively, and a level of the erase voltage Vers may be maintained at a constant level. When the erase voltage Vers starts to discharge at time T3, voltage levels Vgsl1 and Vgsl2 of the first and second ground selection lines GSL1 and GSL2 may decrease together with the erase voltage Vers. Voltage levels Vgsl1 and Vgsl2 of the first and second ground selection lines GSL1 and GSL2 may reach a level of the ground voltage Vss at times t3 and t4, respectively. The erase voltage Vers may reach a level of the ground voltage Vss at time T4.

As described above, a floating point in time of the second ground selection line GSL2 may be adjusted, thereby preventing the programmable second ground selection transistors GST2 from being unintendedly erased during an erase operation.

Figure 12:
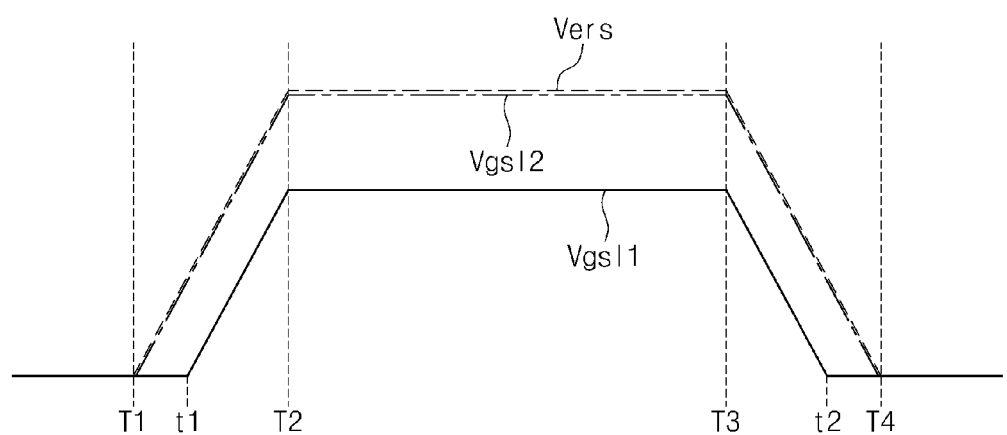
FIG. 12 is a waveform diagram schematically illustrating an exemplary erase method of a nonvolatile memory device, according to certain disclosed embodiments.

FIG. 12 is a waveform diagram schematically illustrating an erase method of a nonvolatile memory device, according to certain exemplary embodiments. Referring to FIG. 12, during an erase operation, the first ground selection line GSL1 may be floated at a point in time which is delayed by a specific time from a point in time when an erase voltage Vers is applied. However, a floating point in time of the second ground selection line GSL2 may be synchronized with a point in time when the erase voltage Vers is applied.

For example, the erase voltage Vers may be applied to a pocket well of the cell array 110 at time T1. At the same time T1, the second ground selection line GSL2 may be floated. In this case, it may be possible to prevent the second ground selection transistors GST2 from being unintendedly erased by the erase voltage Vers.

In contrast, a ground level Vss of the first ground selection line GSL1 may be maintained until time t1. At time t1, the first ground selection line GSL1 may be floated. Voltage levels Vgsl1 and Vgsl2 of the first and second ground selection lines GSL1 and GSL2, respectively, and a level of the erase voltage Vers may be maintained at a constant level from time T2 until time T3. When the erase voltage Vers starts to discharge at time T3, voltage levels Vgsl1 and Vgsl2 of the first and second ground selection lines GSL1 and GSL2 may decrease together with the erase voltage Vers. Voltage levels Vgsl1 and Vgsl2 of the first and second ground selection lines GSL1 and GSL2 may reach a level of the ground voltage Vss at times t2 and T4, respectively. The erase voltage Vers may reach a level of the ground voltage Vss at time T4.

As described above, a floating point in time of the second ground selection line GSL2 may be synchronized with a point in time at which the erase voltage Vers is applied, thereby preventing the programmable second ground selection transistors GST2 from being unintendedly erased during an erase operation.

Figure 13:
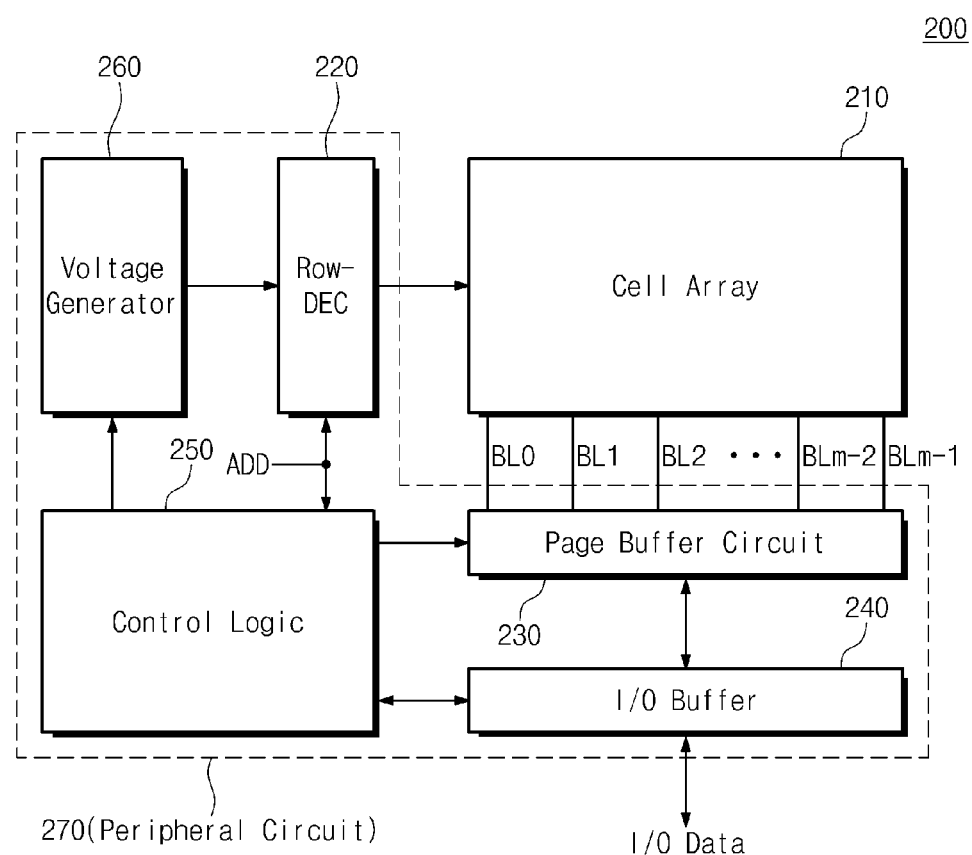
FIG. 13 is a block diagram schematically illustrating an exemplary nonvolatile memory device, according to certain disclosed embodiments.

FIG. 13 is a block diagram schematically illustrating a nonvolatile memory device, according to certain exemplary embodiments. Referring to FIG. 13, a nonvolatile memory device 200 may include a cell array 210, a row decoder 220, a page buffer 230, an input/output buffer 240, control logic 250, and a voltage generator 260. Here, functions of the components 210 to 260 may be substantially the same as those of FIG. 1. The nonvolatile memory device 200 may be classified into, or deemed a part of, the cell array 210 and a peripheral circuit 270 based on a location in a chip thereof. The peripheral circuit 270 may include the row decoder 220, the page buffer 230, the input/output buffer 240, the control logic 250, and the voltage generator 260.

The peripheral circuit 270 may receive a command CMD and an address ADD from an external device. The peripheral circuit 270 may store data, which is received from the external device, at the cell array 210 in response to the received command CMD and address ADD. Alternatively, the peripheral circuit 270 may output data, which is read out from the cell array 210, to the outside in response to the received command CMD and address ADD.

In some embodiments, the cell array 210 may be formed using a COP (cell on peripheral circuit) structure in which the cell array 210 is stacked on an area where the peripheral circuit 270 is formed. In such embodiments, a substrate which is used to stack the cell array 210 may be formed of poly-crystalline silicon which is capable of being deposited or grown. The cell array 210 which is formed on the poly-crystalline silicon substrate may include a first ground selection transistor GST1, which does not include a data storage layer, and a second ground selection transistor GST2, which includes a data storage layer. For example, the first ground selection transistor GST1 which is formed at a location closer to the substrate may operate as a pass transistor, and threshold voltages of second ground selection transistors GST2 which are programmable may be capable of being set. This may allow for adjustment of characteristics of the ground selection transistors GST1 and GST2.

In the nonvolatile memory device 200, the cell array 210 with a three-dimensional structure may be stacked on the peripheral circuit 270. The cell array 210 may include a plurality of vertical NAND strings which are formed to be vertical to a substrate manufactured through, for example, deposition. Each of the vertical NAND strings may include at least one second ground selection transistor GST2, which has the same insulating layer as memory cells, and a first ground selection transistor GST1, which has an oxide layer structure separate from the second ground selection transistor GST2. Specifically, the substrate where the cell array 210 of the nonvolatile memory device 200 is formed may be one of various kinds of substrates deposited or grown or a may be a poly-crystalline silicon substrate. The first ground selection transistors GST1 formed on the poly-crystalline silicon substrate or a substrate manufactured through a deposition or growth process may cause leakage current due to defects of the grain boundary. However, it may be possible to compensate for the leakage current by programming the second ground selection transistors GST2. As used herein, the grain boundary, labeled in one example as GB in FIG. 14, may be understood to be the boundary between the structure on which the cell array 210 is formed and the structure on which the peripheral circuit 270 is formed.

Figure 14:
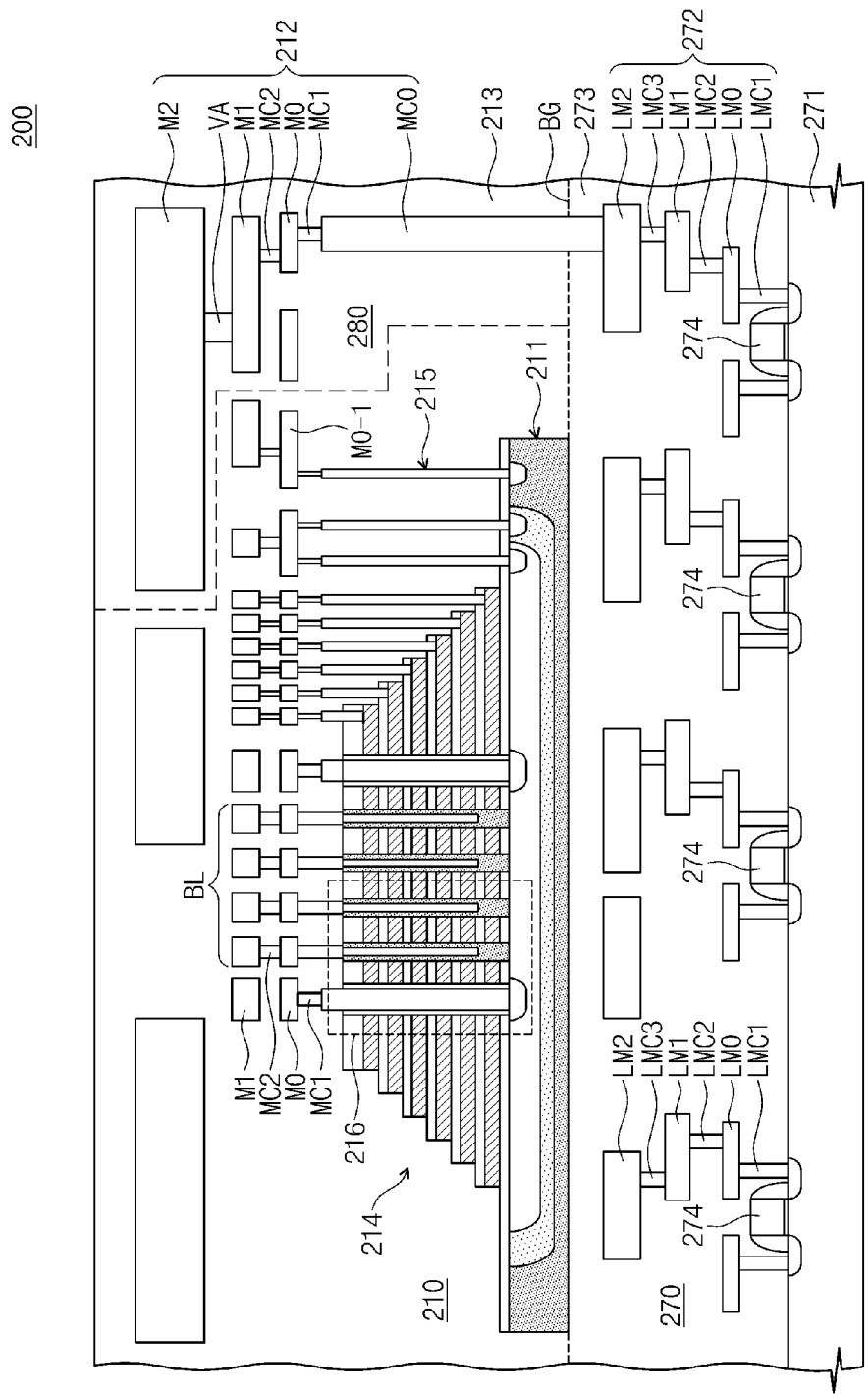
FIG. 14 is a cross-sectional view illustrating an exemplary nonvolatile memory device having a cell on peripheral (COP) circuit structure, according to certain disclosed embodiments.

FIG. 14 is a cross-sectional view illustrating a nonvolatile memory device having a COP structure, according to certain exemplary embodiments. Referring to FIG. 14, the nonvolatile memory device 200 may have a COP structure, in which a cell area 210 is formed and stacked on a peripheral area 270. At least a portion of the peripheral area 270 and at least a portion of the cell area 210 may overlap one another vertically. In some embodiments, the whole of the cell area 210 and the whole of the peripheral area 270 may be overlapped vertically, but the concept is not limited thereto.

The peripheral area 270 may include one or more peripheral transistors 274 on a lower substrate 271, one or more respective peripheral circuit interconnections 272 electrically connected with the respective peripheral transistors 274, and a lower insulating layer 273 covering the peripheral circuit interconnections 272 and the peripheral transistors 274.

The cell area 210 may include an upper substrate 211, a cell array 214 on the upper substrate 211, and an upper insulating layer 213 covering the cell array 214. A cell-to-peripheral circuit connection area 280 may be formed between the cell area 210 and the peripheral area 270 to electrically connect the cell area 210 to the peripheral area 270 so that signals can pass there between. The cell-to-peripheral connection area 280 may further include a connection-circuit interconnection 212 electrically connecting the cell array 214 and the peripheral circuit interconnection 272. The cell array 214 may include a metal contact 215 which electrically connects the cell array 214 and the connection-circuit interconnection 212. Certain lines between circuitry of the peripheral area 270 and circuitry of the cell area 210 are not shown in FIG. 14, as FIG. 14 is a cross-sectional diagram.

In the peripheral area 270, the lower substrate 271 may include a semiconductor substrate such as a silicon wafer. The peripheral circuit interconnections 272 may each include, for example, a lower metal interconnection LM0, an intermediate metal interconnection LM1, and an upper metal interconnection LM2 which are sequentially stacked on the lower substrate 271. The peripheral circuit interconnections 272 may each further include a lower metal contact LMC1 electrically connecting the peripheral transistor 274 and the lower metal interconnection LM0, an intermediate metal contact LMC2 electrically connecting the lower metal interconnection LM0 and the intermediate metal interconnection LM1, and an upper metal contact LMC3 electrically connecting the intermediate metal interconnection LM1 and the upper metal interconnection LM2.

In the cell area 210, the cell array 214 may have a three-dimensional structure in which a plurality of cells is vertically stacked on the upper substrate 211 having a well structure. The metal contact 215 may electrically connect the cells of the cell array 214 to the connection-circuit interconnection 212.

The connection-circuit interconnection 212 may be electrically connected to the peripheral circuit interconnection 272. The connection-circuit interconnection 212 may include a lower metal interconnection M0, an intermediate metal interconnection M1, and an upper metal interconnection M2 which are sequentially stacked on the cell array 214. The connection-circuit interconnection 212 may further include a connection metal contact MC0 electrically connecting the peripheral circuit interconnection 272 to the connection circuit interconnection 212, a lower metal contact MC1 electrically connecting the connection metal contact MC0 and the lower metal interconnection M0, an intermediate metal contact MC2 electrically connecting the lower metal interconnection M0 to the intermediate metal interconnection M1, and a via VA being an upper metal contact electrically connecting the intermediate metal interconnection M1 to the upper metal interconnection M2. The lower metal contact MC1 may connect the cell array 214 to the intermediate metal interconnection M0. The intermediate metal interconnection M1 may include a bit line BL which is electrically connected to a vertical channel of the cell array 214. Though only one connection-circuit interconnection 212 is depicted in FIG. 14, a plurality of connection-circuit interconnections 212 may be included to connect the various peripheral transistors 274 to different portions of the cell array 214. As can be seen from FIG. 14, transistors in the cell array 214 may be disposed vertically above transistors in the peripheral circuit, for example, by being disposed on a first, upper substrate 211 positioned above a second, lower substrate 271. In addition, as shown, between the lower substrate 271 and upper substrate 211, each which may be formed of a semiconductor material from a semiconductor wafer, a portion of lower insulating layer 273 may be formed.

Figure 15:
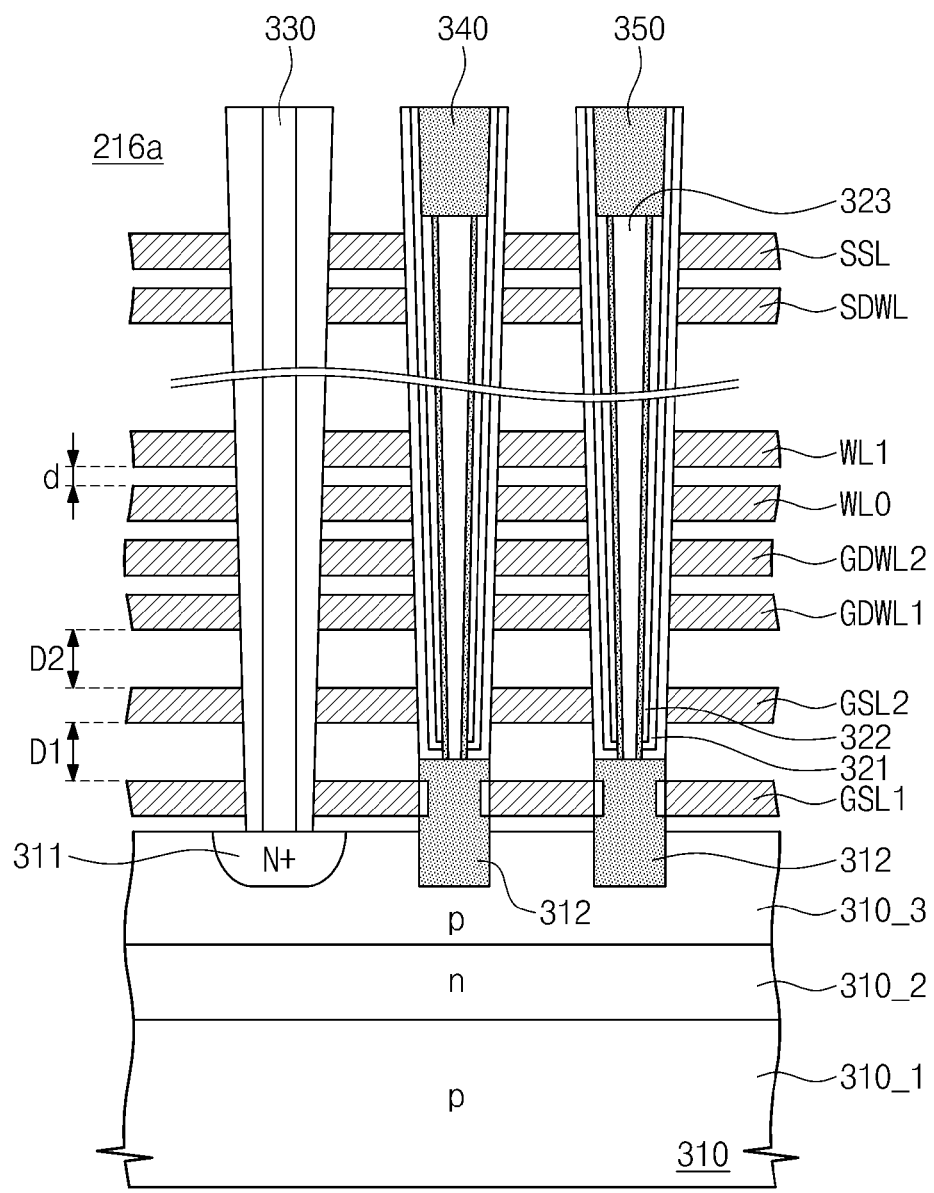
FIG. 15 is a cross-sectional view schematically illustrating an exemplary cell string structure of FIG. 14, according to certain disclosed embodiments.

FIG. 15 is a cross-sectional view schematically illustrating a cell string structure 216a of FIG. 14. Referring to FIG. 15, a well area, which is doped with dopants of a first conductivity type, may be formed in a substrate 310. The substrate 310 may correspond to the upper substrate 211 of FIG. 14. The substrate 310 may be formed of poly-crystalline silicon capable of being deposited or grown on the peripheral area 270 through deposition.

The substrate 310 may include a well structure, which is formed by doping a poly-crystalline silicon layer to have a first conductivity type (e.g., p-type) and a second conductivity type (e.g., n-type). The well structure may be classified into a deep well 310_2, which is doped to have the second conductivity type (e.g., n-type), and a base substrate 310_1, which surrounds the deep well 310_2 and is doped to have the first conductivity type (e.g., p-type). The deep well 310_2 may allow the pocket well 310_3 to be electrically and spatially spaced from the base substrate 310_1.

A stack structure which includes insulating patterns and gate patterns stacked alternately and iteratively may be disposed on the substrate 310. The gate patterns may be used as the ground selection lines GSL1 and GSL2, the dummy word lines GDWL1, GDWL2, and SDWL, the word lines WL0 to WL63, and the string selection line SSL.

A common source plug 330 may be formed which is electrically connected with the pocket well 310_3 of the substrate 310. The common source plug 330 may be electrically isolated from the stacked gate patterns. First dopants may be injected at a high dose into a portion 311 of the pocket well 310_3 to electrically connect the substrate 310 and the common source plug 330. A specific voltage may be provided to the pocket well 310_3 corresponding to the common source line CSL through the common source plug 330.

A vertical channel 323 which penetrates the gate patterns may be formed to implement a cell string. A contact plug 350 may be formed on the vertical channel 323 and may be used as a drain of the cell string. An active pattern 312 may be formed between a bottom end portion of the vertical channel 323 and the pocket well 310_3. An insulating layer 321, a data storage layer 322, and the like may be formed between the vertical channel 323 and the gate patterns. The data storage layer 322 may not exist at an area where the active pattern 312 and a gate pattern intersect. Accordingly, the first ground selection transistor GST1 which is defined by the active pattern 312 and the lowermost gate pattern may not have a function of storing data.

The lowermost gate pattern of the gate patterns may be used as the first ground selection line GSL1. A gate pattern positioned on the first ground selection line GSL1 may be used as the second ground selection line GSL2. The dummy word lines GDWL1 and GDWL2, the word lines WL0 to WL63, and the dummy word line SDWL may be formed on the second ground selection line GSL2. The uppermost gate pattern may be used as the string selection line SSL.

Here, a distance D1 between a gate pattern corresponding to the first ground selection line GSL1 and a pattern corresponding to the second ground selection line GSL2 may be different from a distance "d" between word lines (e.g., WL0 to WL1, WL1 to WL2, WL2 to WL3, etc.). In addition, a distance D2 between a gate pattern corresponding to the second ground selection line GSL2 and a pattern corresponding to the first dummy word line GDWL1 may be different from the distance "d" between the word lines.

FIG. 16 is a table schematically illustrating a bias condition of a cell string of FIG. 15 for an exemplary operating mode. Referring to FIG. 16, voltages may be applied to cell strings at an erase operation, a program operation, and a read operation.

During the erase operation, an erase voltage Vers may be applied to the pocket well 310_3. A bit line BLi, the string selection line SSL, the common source line CSL, and the dummy word lines GDWL1, and GDWL2 may be set to a floating state. Specifically, the ground selection lines GSL1 and GSL2 may be floated at the same time when the erase voltage Vers is applied or may be floated after the erase voltage Vers is applied and a time elapses. Alternatively, one of the ground selection lines GSL1 and GSL2 may be floated at the same time when the erase voltage Vers is applied, and the other thereof may be floated after the erase voltage Vers is applied and a time elapses. In either case, the ground selection line GSL1 may change from the ground voltage Vss to the floating state. The ground selection transistors GST2, which are capable of being programmed, may be prevented from being erased by adjusting a floating point in time. Next, the ground voltage Vss or a voltage of 0 V may be applied to the word lines WL0 to WL63.

In the case of a program operation for programming selected memory cells, the ground voltage Vss may be applied to a program bit line of the bit lines BLi, and the power supply voltage Vcc may be applied to a program-inhibit bit line of the bit lines BLi. Under the condition that the bit lines are set as described above, a turn-on voltage of (Vcc+Vth) (Vth being a threshold voltage of a string selection transistor) may be applied to the string selection line SSL of a selected memory block. The ground voltage Vss may be applied to the common source line CSL and the ground selection lines GSL1 and GSL2. At this time, the first ground selection voltage Vg1 which is higher than the ground voltage Vss may be applied to the first ground selection line GSL1. Also, it may be understood that the second ground selection voltage Vg2 which is higher than the ground voltage Vss may be applied to the second ground selection line GSL2. The program voltage Vpgm may be applied to a selected word line of word lines WL0 to WL63, and the pass voltage Vpass may be applied to unselected word lines of word lines WL0 to WL63. The pass voltage Vpass may be applied to the dummy word lines SDWL, GDWL1, and GDWL2. However, a voltage which is different in level from a voltage applied to the unselected word lines may be applied to the dummy word lines SDWL, GDWL1, and GDWL2.

During the read operation, the bit line BLi may be charged with a pre-charge voltage Vprch, the read voltage Vrd may be applied to the selected word line of word lines WL0 to WL63, and the non-selection read voltage Vread may be applied to the unselected word lines of word lines WL0 to WL63. At this time, the ground voltage Vss may be applied to the common source line CSL. In addition, the non-selection read voltage Vread may be applied to the string selection line SSL and the dummy word lines SDWL, GDWL1, and GDWL2, and the non-selection read voltage Vread may be applied to the ground selection lines GSL1 and GSL2.

Reliability of operation may be improved according to a combination of the first ground selection transistor GST1 and the second ground selection transistor GST2. In some embodiments, defects of the first ground selection transistor GST1 may be accounted for and compensated by programming the second ground selection transistors GST2 to have a suitable threshold voltage.

Figure 17:
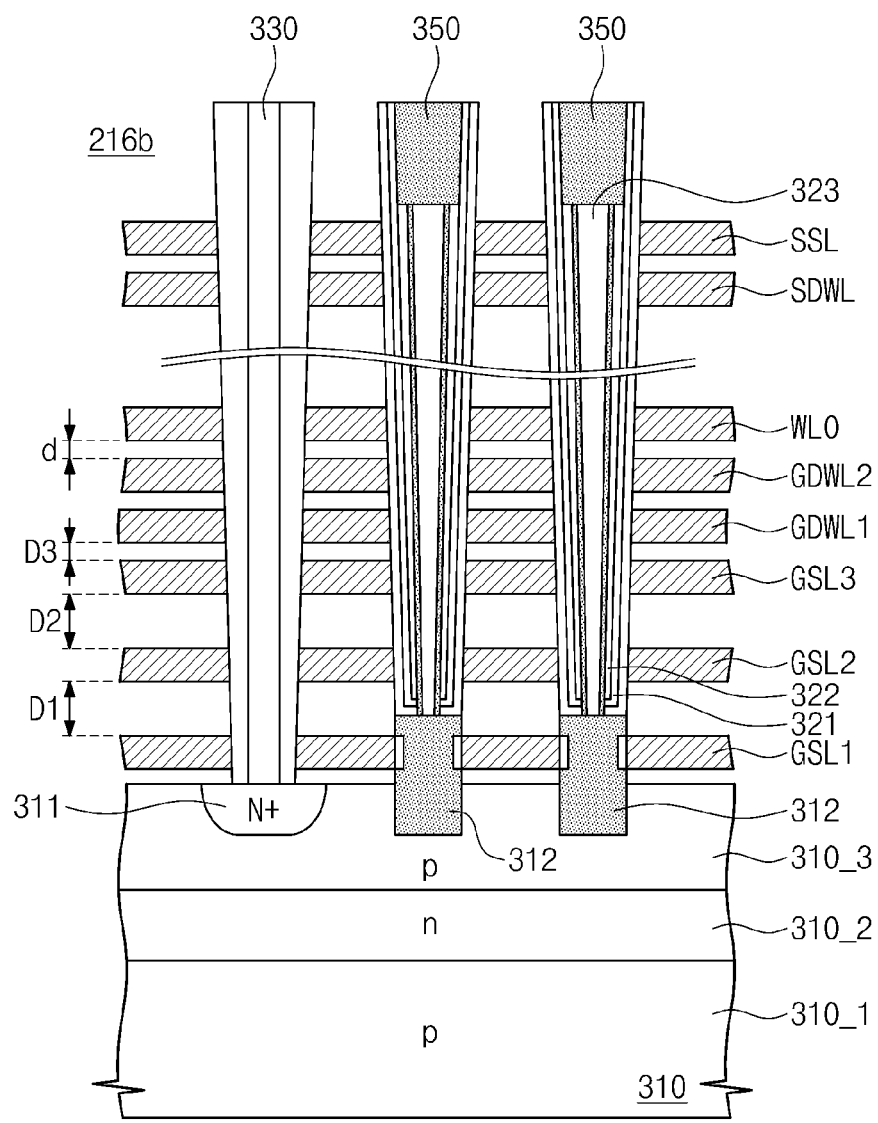
FIG. 17 is a cross-sectional view schematically illustrating an exemplary cell string structure of FIG. 14, according to certain disclosed embodiments.

FIG. 17 is a cross-sectional view schematically illustrating a cell string structure 216b of FIG. 14, according to certain exemplary embodiments. Referring to FIG. 17, a well area which is doped with dopants of a first conductivity type may be formed in the substrate 310. The substrate 310 may correspond to the upper substrate 211 of FIG. 14. The substrate 310 may be formed of poly-crystalline silicon which is deposited or grown on the peripheral area 270 through deposition.

The substrate 310 may include a well structure which is formed by doping a poly-crystalline silicon layer to have a first conductivity type (e.g., p-type) and a second conductivity type (e.g., n-type). The well structure may be classified into the deep well 310_2, which is doped to have the second conductivity type (e.g., n-type), and the base substrate 310_1, which surrounds the deep well 310_2 and is doped to have the first conductivity type (e.g., p-type). The deep well 310_2 may allow the pocket well 310_3 to be electrically and spatially spaced from the base substrate 310_1.

A stack structure which includes insulating patterns and gate patterns stacked alternately and iteratively may be disposed on the substrate 310. The gate patterns may be used as the ground selection lines GSL1, GSL2, and GSL3, the dummy word lines GDWL1, GDWL2, and SDWL, the word lines WL0 to WL63, and the string selection line SSL.

The common source plug 330 may be formed which is electrically connected with the pocket well 310_3 of the substrate 310. The common source plug 330 may be electrically isolated from the stacked gate patterns. First dopants may be injected at a high dose into the portion 311 of the pocket well 310_3 to electrically connect the substrate 310 and the common source plug 330. A specific voltage may be provided to the pocket well 310_3 corresponding to the common source line CSL through the common source plug 330.

The vertical channel 323 which penetrates the gate patterns may be formed to implement a cell string. The contact plug 350 may be formed on the vertical channel 323 and may be used as a drain of the cell string. The active pattern 312 may be formed between a bottom end portion of the vertical channel 323 and the pocket well 310_3. The insulating layer 321, the data storage layer 322, and the like may be formed between the vertical channel 350 and the gate patterns. The data storage layer 322 may not exist at an area where the active pattern 312 and a gate pattern intersect. Accordingly, the first ground selection transistor GST1 which is defined by the active pattern 312 and the lowermost gate pattern may not function to store data.

The lowermost gate pattern of the gate patterns may be used as the first ground selection line GSL1. A gate pattern positioned on the first ground selection line GSL1 may be used as the second ground selection line GSL2. A gate pattern positioned on the second ground selection line GSL2 may be used as the third ground selection line GSL3. The dummy word lines GDWL1 and GDWL2, the word lines WL0 to WL63, and the dummy word line SDWL may be formed on the third ground selection line GSL3. The uppermost gate pattern may be used as the string selection line SSL.

Here, a distance D1 between a gate pattern corresponding to the first ground selection line GSL1 and a pattern corresponding to the second ground selection line GSL2 may be different from a distance "d" between word lines (e.g., WL0 to WL1, WL1 to WL2, WL2 to WL3, etc.). In addition, a distance D2 between a gate pattern corresponding to the second ground selection line GSL2 and a pattern corresponding to the third ground selection line GSL3 may be different from the distance "d" between the word lines. Furthermore, a distance D3 between a gate pattern corresponding to the third ground selection line GSL3 and a pattern corresponding to the first dummy word line GDWL1 may be different from the distance "d" between the word lines.

FIG. 18 is a table schematically illustrating a bias condition of cell string 216b of FIG. 17 for an operating mode. Referring to FIG. 18, voltages may be applied to cell strings at an erase operation, a program operation, and a read operation.

During the erase operation, an erase voltage Vers may be applied to the pocket well 310_3. A bit line BLi, the string selection line SSL, the common source line CSL, the dummy word lines SDWL, GDWL1, and GDWL2 may be set to a floating state. The ground selection lines GSL1, GSL2, and GSL3 may be floated at the same time when the erase voltage Vers is applied or may be floated after the erase voltage Vers is applied and a time elapses. Alternatively, a part of the ground selection lines GSL1, GSL2, and GSL3 may be floated at the same time when the erase voltage Vers is applied, and the rest thereof may be floated after the erase voltage Vers is applied and a time elapses. In either case, the ground selection line GSL1 may change from the ground voltage Vss to the floating state. The ground selection transistors GST2, which are capable of being programmed, may be prevented from being erased by adjusting a floating point in time. Next, the ground voltage Vss or a voltage of 0 V may be applied to the word lines WL0 to WL63.

In the case of a program operation for programming selected memory cells, the ground voltage Vss may be applied to a program bit line of the bit lines BLi, and the power supply voltage Vcc may be applied to a program-inhibit bit line of the bit lines BLi. Under the condition that the bit lines are set as described above, a turn-on voltage of (Vcc+Vth) (Vth being a threshold voltage of a string selection transistor) may be applied to the string selection line SSL of a selected memory block. The ground voltage Vss may be applied to the common source line CSL and the ground selection lines GSL1, GSL2, and GSL3. At this time, the first ground selection voltage Vg1 which is higher than the ground voltage Vss may be applied to the first ground selection line GSL1. Also, it may be understood that the second ground selection voltage Vg2 which is higher than the ground voltage Vss is applied to the second and third ground selection lines GSL2 and GSL3. The program voltage Vpgm may be applied to a selected word line of word lines WL0 to WL63, and the pass voltage Vpass may be applied to unselected word lines of word lines WL0 to WL63. The pass voltage Vpass may be applied to the dummy word lines SDWL, GDWL1, and GDWL2. However, a voltage which is different in level from a voltage applied to the unselected word lines may be applied to the dummy word lines SDWL, GDWL1, and GDWL2.

During the read operation, the bit line BLi may be charged with a pre-charge voltage Vprch, the read voltage Vrd may be applied to the selected word line of word lines WL0 to WL63, and the non-selection read voltage Vread may be applied to the unselected word lines of word lines WL0 to WL63. At this time, the ground voltage Vss may be applied to the common source line CSL. In addition, the non-selection read voltage Vread may be applied to the string selection line SSL and the dummy word lines SDWL, GDWL1, and GDWL2, and the non-selection read voltage Vread may be applied to the ground selection lines GSL1, GSL2, and GSL3.

Reliability of operation may be improved according to a combination of the first ground selection transistor GST1, which is not able to be programmed, and the second and third ground selection transistors GST2 and GST3, which are able to be programmed. In some embodiments, it is anticipated that defects of the grain boundary occurring at the first ground selection transistor GST1 may be accounted for and compensated by programming the second ground selection transistor GST2 and/or the third ground selection transistor GST3.

In the above embodiments, a NAND string which has a structure including one ground selection transistor, which is not able to be programmed (e.g., a non-programmable ground selection transistor), and at least ground selection transistor, which is able to be programmed (e.g., a programmable ground selection transistor), may be described. However, the scope and spirit of the disclosed embodiments may not be limited thereto. For example, the scope and spirit of the disclosed embodiments may be applicable to a NAND cell string which includes a plurality of ground selection transistors which are not able to be programmed.

Figure 19:
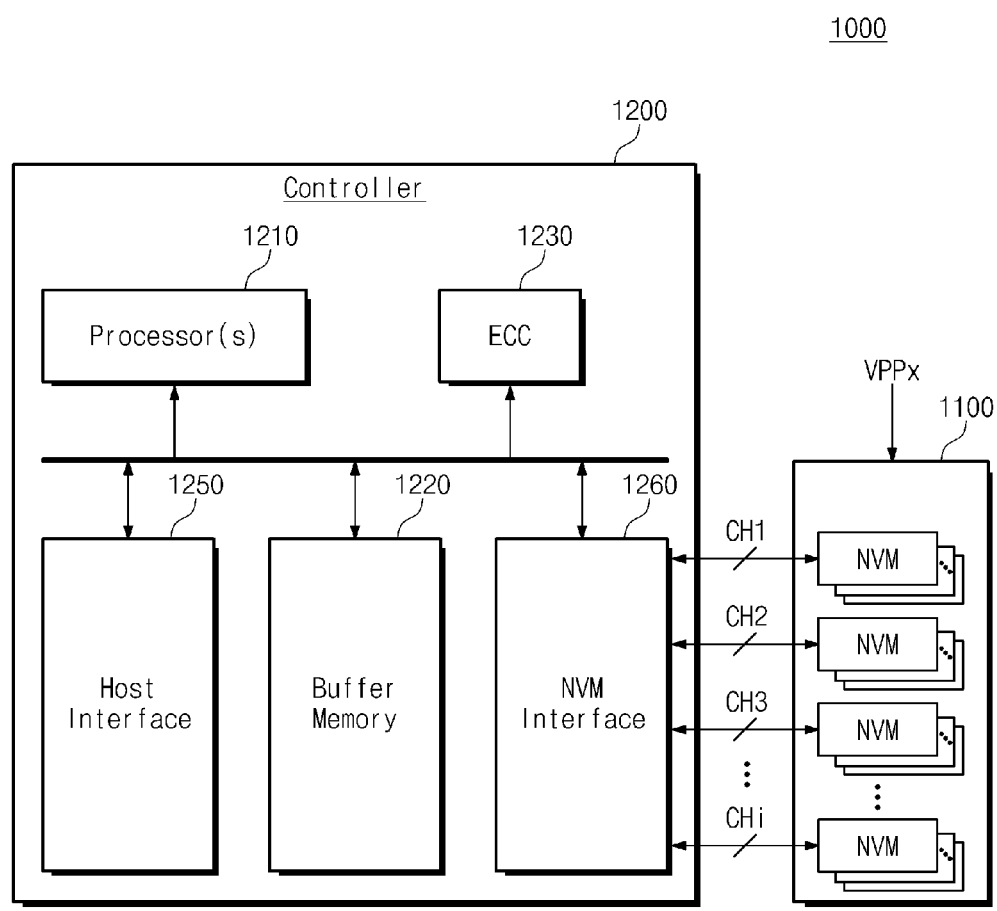
FIG. 19 is a block diagram schematically illustrating an exemplary solid state drive, according to certain disclosed embodiments.

FIG. 19 is a block diagram schematically illustrating a solid state drive according to certain exemplary embodiments. Referring to FIG. 19, a solid state drive (hereinafter, referred to as an "SSD") 1000 may include a plurality of nonvolatile memory devices 1100 and an SSD controller 1200.

In some embodiments, the nonvolatile memory devices 1100 may be implemented to be provided with an external high voltage VPPx. Although not shown, each of the nonvolatile memory devices 1100 may include a ground selection line, such as the ground selection lines described with reference to FIGS. 1 to 18. For example, each of the nonvolatile memory devices 1100 may include a first ground selection transistor GST1, which does not include a charge storage layer, and a second ground selection transistor GST2, which includes a charge storage layer. The first and second ground selection transistors GST1 and GST2 may be formed on a poly-crystalline silicon substrate separate from a substrate on which a peripheral circuit is formed (e.g., the substrates may be vertically above and below each other respectively). In the nonvolatile memory devices 1100, characteristics of ground selection transistors may be improved by programming the second ground selection transistor GST2.

The SSD controller 1200 may be connected to the non-volatile memory devices 1100 through a plurality of channels CH1 through CHi (i being an integer of 2 or more). The SSD controller 1200 may include one or more processors 1210, a buffer memory 1220, an ECC block 1230, a host interface 1250, and a nonvolatile memory interface 1260.

The buffer memory 1220 may temporarily store data needed to drive the SSD controller 1200. In exemplary embodiments, the buffer memory 1220 may include a plurality of memory lines each of which stores data or commands. In the disclosed embodiments, the memory lines may be mapped onto cache lines in various manners.

The ECC block 1230 may be configured to calculate an ECC value corresponding to data to be programmed at a write operation, correct a read data error based on an ECC value at a read operation, and correct a data restored error from the nonvolatile memory device 1100 at a data restoration operation. Although not shown in FIG. 19, a code memory may be further included to store code data to drive the SSD controller 1200. The code memory may be implemented with a nonvolatile memory device.

The host interface 1250 may provide an interface with one or more external devices. The host interface 1250 may be a NAND flash interface. The nonvolatile memory interface 1260 may provide an interface with the nonvolatile memory devices 1100.

Figure 20:
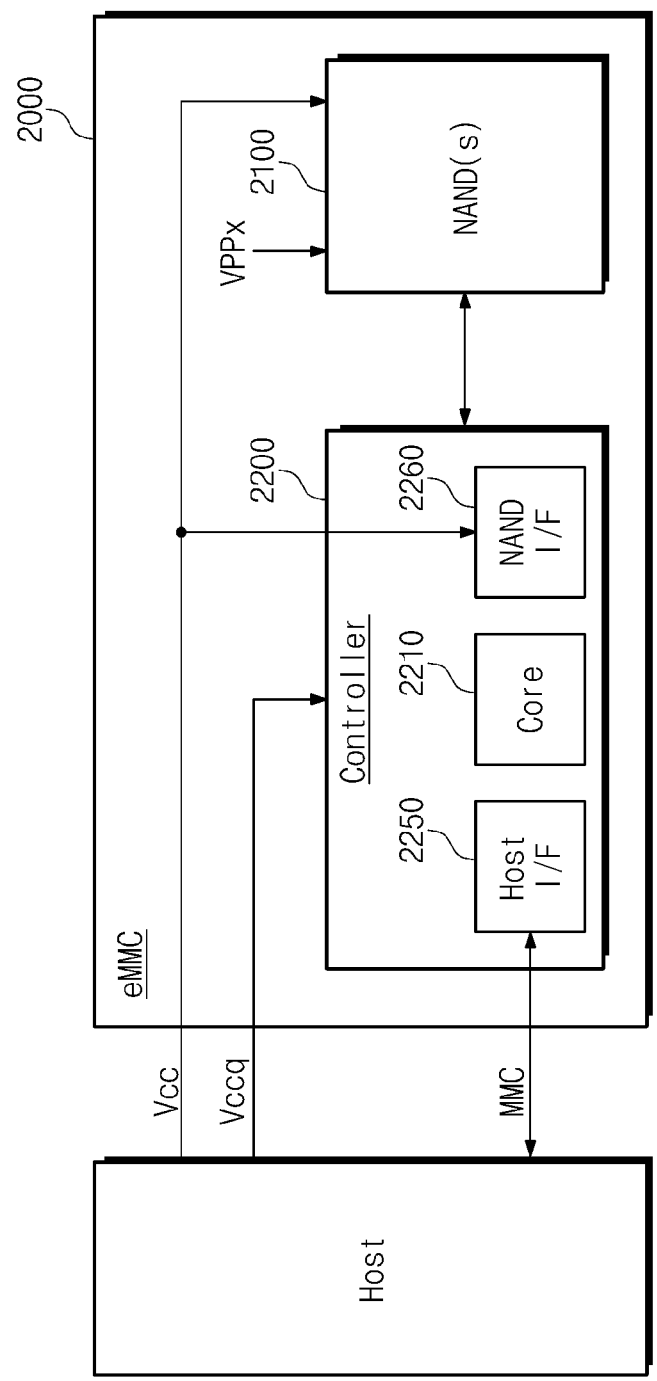
FIG. 20 is a block diagram schematically illustrating an exemplary embedded multimedia card (eMMC), according to certain disclosed embodiments.

The disclosed embodiments may be applicable to an eMMC (e.g., an embedded multimedia card, moviNAND, iNAND, etc.). FIG. 20 is a block diagram schematically illustrating an eMMC according to certain exemplary embodiments. Referring to FIG. 20, an eMMC 2000 may include one or more NAND flash memory devices 2100 and a controller 2200.

The NAND flash memory device 2100 may be a single data rate (SDR) NAND flash memory device or a double data rate (DDR) NAND flash memory device. Alternatively, the NAND flash memory device 2100 may be a vertical NAND flash memory device (VNAND). Although not shown, the NAND flash memory device 2100 may include a ground selection line, such as the ground selection lines described with reference to FIGS. 1 to 18. For example, the NAND flash memory device 2100 may include a first ground selection transistor GST1, which does not include a charge storage layer, and a second ground selection transistor GST2, which does include a charge storage layer. The first and second ground selection transistors GST1 and GST2 may be formed on a poly-crystalline silicon substrate separate from a substrate on which a peripheral circuit is formed (e.g., the substrates may be vertically above and below each other respectively). Accordingly, in the example NAND flash memory device 2100, characteristics of ground selection transistors may be improved by programming the second ground selection transistor GST2.

The controller 2200 may be connected to the NAND flash memory device 2100 through a plurality of channels (not shown). The controller 2200 may include at least one controller core 2210, a host interface 2250, and a NAND interface 2260. The controller core 2210 may control an overall operation of the eMMC 2000. The host interface 2250 may be configured to perform an interface between the controller 2200 and a host. The NAND interface 2260 may be configured to provide an interface between the NAND flash memory device 2100 and the controller 2200. In exemplary embodiments, the host interface 2250 may be a parallel interface (e.g., MMC interface). In other exemplary embodiments, the host interface 2250 of the eMMC 2000 may be a serial interface (e.g., UHS-II, UFS interface, etc.). As another example, the host interface 2250 may be a NAND interface.

The eMMC 2000 may receive power supply voltages Vcc and Vccq from the host. Here, the first power supply voltage Vcc (e.g., about 3.3 V) may be supplied to the NAND flash memory device 2100 and the NAND interface 2260, and the second power supply voltage Vccq (e.g., about 1.8 V/3.3 V) may be supplied to the controller 2200. In exemplary embodiments, the eMMC 2000 may be optionally supplied with an external high voltage Vppx.

Figure 21:
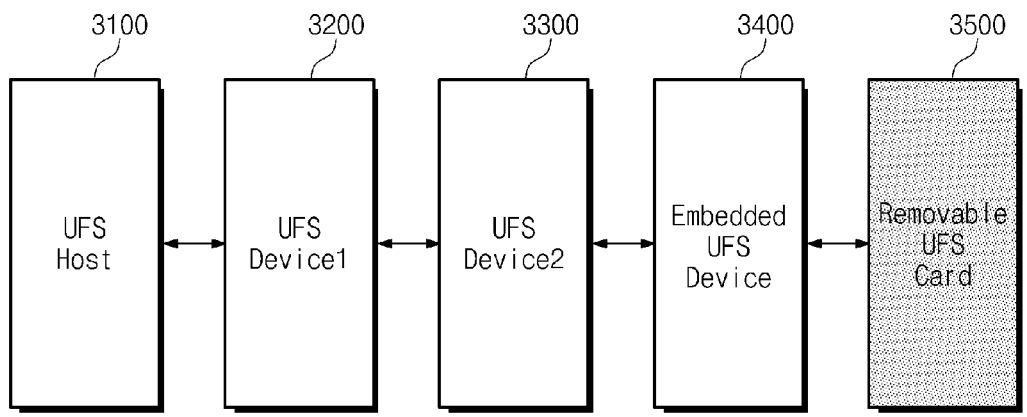
FIG. 21 is a block diagram schematically illustrating an exemplary universal file storage (UFS) system, according to certain disclosed embodiments.

The disclosed embodiments may be applicable to universal flash storage (UFS). FIG. 21 is a block diagram schematically illustrating a UFS system according to certain exemplary embodiments. Referring to FIG. 21, a UFS system 3000 may include a UFS host 3100, UFS devices 3200 and 3300, an embedded UFS device 3400, and a removable UFS card 3500. The UFS host 3100 may be an application processor of a mobile device. Each of the UFS host 3100, the UFS devices 3200 and 3300, the embedded UFS device 3400, and the removable UFS card 3500 may communicate with external devices by the UFS protocol. At least one of the UFS devices 3200 and 3300, the embedded UFS device 3400, and the removable UFS card 3500 may include a ground selection line, such as the ground selection lines described with reference to FIGS. 1 to 18. For example, at least one of the UFS devices 3200 and 3300, the embedded UFS device 3400, and the removable UFS card 3500 may include a first ground selection transistor GST1, which does not include a charge storage layer, and a second ground selection transistor GST2, which does include a charge storage layer. The first and second ground selection transistors GST1 and GST2 may be formed on a poly-crystalline silicon substrate separate from a substrate on which a peripheral circuit is formed (e.g., the substrates may be vertically above and below each other respectively). Accordingly, in at least one of the UFS devices 3200 and 3300, the embedded UFS device 3400, and the removable UFS card 3500, characteristics of ground selection transistors may be improved by programming the second ground selection transistor GST2.

Meanwhile, communication between the embedded UFS device 3400 and the removable UFS device 3500 may be made using protocols different from the UFS protocol. The UFS host 3100 and the removable UFS card 3500 may communicate through various card protocols (e.g., UFDs, MMC, SD (secure digital), mini SD, Micro SD, etc.).

Figure 22:
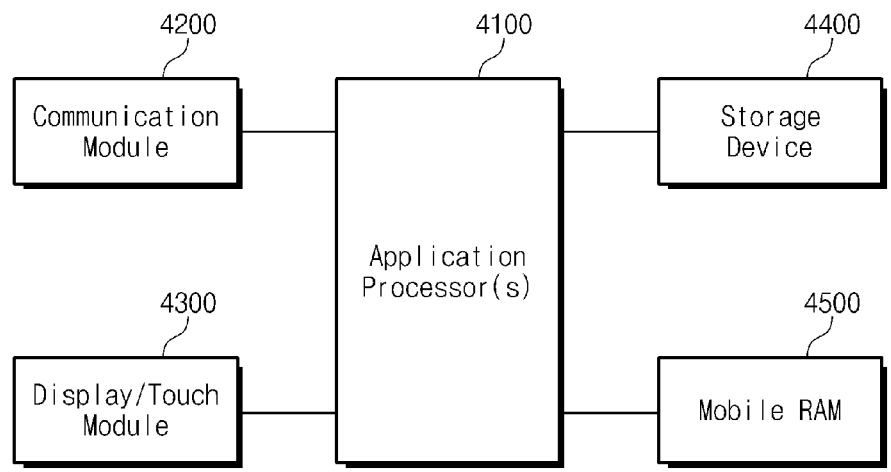
FIG. 22 is a block diagram schematically illustrating an exemplary mobile device, according to certain exemplary embodiments.

The disclosed embodiments may be applicable to a mobile device. FIG. 22 is a block diagram schematically illustrating a mobile device according to certain exemplary embodiments. Referring to FIG. 22, a mobile device 4000 may include an application processor 4100, a communication module 4200, a display/touch module 4300, a storage device 4400, and a mobile RAM 4500.

The application processor 4100 may control an overall operation of the mobile device 4000, and the communication module 4200 may perform wireless/wire communications with an external device. The display/touch module 4300 may be implemented to display data processed by the application processor 4100 and/or to receive data through a touch panel. The storage device 4400 may be implemented to store user data. The storage device 4400 may be, but not limited to, an eMMC, an SSD, or an UFS device. The mobile RAM 4500 may temporarily store data needed for an operation of the mobile device 4000.

The storage device 4400 may include a ground selection line, such as the ground selection lines described with reference to FIGS. 1 to 18. For example, the storage device 4400 may include a first ground selection transistor GST1, which does not include a charge storage layer, and a second ground selection transistor GST2, which does include a charge storage layer, the first and second ground selection transistors GST1 and GST2 being formed on a poly-crystalline silicon substrate separate from a substrate on which a peripheral circuit is formed (e.g., the substrates may be vertically above and below each other respectively). Accordingly, in the storage device 4400, characteristics of ground selection transistors may be improved by programming the second ground selection transistor GST2.

A memory system or a storage device according to certain disclosed embodiments may be packaged according to any of a variety of different packaging technologies. Examples of such packaging technologies may include the following: PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

According to certain exemplary embodiments, since a threshold voltage of a ground selection transistor is set within a uniform distribution, reliability of a nonvolatile memory device in which a cell string is formed in a direction perpendicular to a substrate may be improved. In addition, it may be possible to adjust (or change) a characteristic of a ground selection transistor due to defects of the grain boundary occurring at a cell string structure formed on a substrate other than a single-crystalline silicon substrate. Accordingly, it may be possible to improve reliability of a nonvolatile memory device which has a vertical structure formed on a poly-crystalline silicon substrate or reliability of a nonvolatile memory device which has a COP (cell on peripheral circuit) structure with respect to a cell array and a peripheral circuit.

While the disclosed embodiments have been described with reference to exemplary embodiments, it will be apparent to those skilled in the art that various changes and modifications may be made without departing from the spirit and scope of the disclosed concepts. Therefore, it should be understood that the above embodiments are not limiting, but illustrative.

What is claimed is:

1. A three-dimensional semiconductor memory device comprising:
   a cell array formed on a first substrate; and
   a peripheral circuit formed on a second substrate that is at least partially overlapped by the first substrate, the peripheral circuit being configured to provide signals for controlling the cell array,
   wherein the cell array comprises:
   insulating patterns and gate patterns stacked alternately on the first substrate; and
   at least a first pillar formed in a direction perpendicular to the first substrate and being in contact with the first substrate through the insulating patterns and the gate patterns,
   wherein a first ground selection transistor includes a first gate pattern, adjacent to the first substrate and the first pillar, and a second ground selection transistor includes a second gate pattern positioned on the first gate pattern and the first pillar, and
   wherein the first ground selection transistor is not programmable, and the second ground selection transistor is programmable.

2. The three-dimensional semiconductor memory device of claim 1, wherein the first substrate comprises a poly-crystalline silicon semiconductor.

3. The three-dimensional semiconductor memory device of claim 1, wherein the first pillar comprises:
   a lower active pattern crossing the first gate pattern; and
   an upper active pattern crossing the second gate pattern.

4. The three-dimensional semiconductor memory device of claim 3, wherein the lower active pattern is provided in the form of a pillar and the upper active pattern is provided in the form of a tube which is filled with a filling dielectric pattern.

5. The three-dimensional semiconductor memory device of claim 1, wherein a third gate pattern corresponding to a dummy word line and gate patterns corresponding to a plurality of word lines are formed on the second gate pattern, and
   wherein a distance between the second gate pattern and the third gate pattern is wider than a cell distance between adjacent gate patterns among the plurality of word lines.

6. The three-dimensional semiconductor memory device of claim 1, wherein a threshold voltage of the second ground selection transistor is set according to a characteristic of the first ground selection transistor.

7. The three-dimensional semiconductor memory device of claim 6, wherein the first gate pattern is separated into a plurality of segments corresponding to a plurality of planes, and
   wherein, at a program verify operation on the second ground selection transistor, the first gate pattern is activated by a stacked plane set and a verify operation is performed by the stacked plane set.

8. The three-dimensional semiconductor memory device of claim 1, wherein the device is configured such that a level of a voltage applied to the first gate pattern is identical to that applied to the second gate pattern.

9. The three-dimensional semiconductor memory device of claim 1, wherein the device is configured such that during a program operation on the cell array, a ground voltage is applied to a first ground selection line connected to the first gate pattern and to a second ground selection line connected to the second gate pattern.

10. The three-dimensional semiconductor memory device of claim 1, wherein the device is configured such that during a program operation on the cell array, a first ground selection voltage higher than a ground voltage is applied to a first ground selection line connected to the first gate pattern, and the ground voltage is applied to a second ground selection line connected to the second gate pattern.

11. The three-dimensional semiconductor memory device of claim 1, wherein the device is configured such that during a program operation on the cell array, a ground voltage is applied to a first ground selection line connected to the first gate pattern and a second ground selection voltage higher than the ground voltage is applied to a second ground selection line connected to the second gate pattern.

12. The three-dimensional semiconductor memory device of claim 1, wherein the device is configured such that during a program operation on the cell array, a first ground selection voltage is applied to a first ground selection line connected to the first gate pattern and a second ground selection voltage higher than the first ground selection voltage is applied to a second ground selection line connected to the second gate pattern.

13. A three-dimensional semiconductor memory device comprising:
   a peripheral circuit formed on a first substrate;
   a second substrate at least partially overlapping the first substrate and including a poly-crystalline silicon semiconductor;
   a stack structure including insulating patterns and gate patterns stacked alternately on the second substrate; and
   at least a first pillar penetrating the stack structure and contacting the second substrate through conductive material and insulating materials in a direction perpendicular to the second substrate,
   wherein a first ground selection transistor having a first gate insulating layer is formed to include the first pillar and a first gate pattern and is adjacent to the second substrate, and a second ground selection transistor having a second gate insulating layer is formed to include the first pillar and a second gate pattern, which is positioned on the first gate pattern, and
   wherein the first ground selection transistor does not include a charge storage layer.

14. The three-dimensional semiconductor memory device of claim 13, wherein the first pillar comprises:
   a lower active pattern penetrating the first gate pattern and contacting a well area of the second substrate; and
   an upper active pattern penetrating the second gate pattern and stacked on the lower active pattern.

15. The three-dimensional semiconductor memory device of claim 14, wherein the lower active pattern comprises a poly-crystalline silicon semiconductor.

16. The three-dimensional semiconductor memory device of claim 15, wherein a first ground selection transistor including the lower active pattern and the first gate pattern comprises a vertical channel perpendicular to the second substrate and a horizontal channel parallel to the second substrate.

17. The three-dimensional semiconductor memory device of claim 13, wherein a third gate pattern corresponding to a dummy word line is provided on the second gate pattern, and
   wherein a distance between the second gate pattern and the third gate pattern is wider than a distance between gate patterns corresponding to cells for storing data.

18. A three-dimensional semiconductor memory device comprising:
   a cell array formed on a first substrate, the cell array including a plurality of vertical NAND strings,
   a peripheral circuit formed on a second substrate that at least partially overlaps the first substrate, the peripheral circuit being configured to provide signals for controlling the cell array;
   a connection circuit interconnection electrically connecting the cell array with the peripheral circuit;
   wherein the cell array comprises:
      a first gate transistor including a first gate pattern and an epitaxial layer; and
      at least one second gate transistor including a second gate pattern, wherein the at least one second gate transistor is programmable.

19. The three-dimensional semiconductor memory device of claim 18, wherein the first substrate comprises a poly-crystalline silicon semiconductor.

20. The three-dimensional semiconductor memory device of claim 18, further comprising:
   a third gate pattern corresponding to a dummy word line;
   fourth gate patterns corresponding to a plurality of word lines are formed on the second gate pattern, and
   wherein a distance between the second gate pattern and the third gate pattern is wider than a cell distance between adjacent fourth gate patterns.

* * * * *